(12) United States Patent
Mohan et al.

(10) Patent No.: US 10,530,370 B1
(45) Date of Patent: Jan. 7, 2020

(54) GLITCH-FREE PLL MULTIPLEXER

(71) Applicant: Marvell International Ltd., Hamilton (BM)

(72) Inventors: Nitin Mohan, Northborough, MA (US); Georgios Faldamis, Somerville, MA (US); Thucydides Xanthopoulos, Watertown, MA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/209,709

(22) Filed: Dec. 4, 2018

Related U.S. Application Data

(60) Provisional application No. 62/770,293, filed on Nov. 21, 2018.

(51) Int. Cl.
| | |
|---|---|
| *H03L 7/07* | (2006.01) |
| *H03L 7/08* | (2006.01) |
| *H03K 19/20* | (2006.01) |
| *H03K 5/135* | (2006.01) |
| *H03K 5/00* | (2006.01) |

(52) U.S. Cl.
CPC .............. *H03L 7/07* (2013.01); *H03K 5/135* (2013.01); *H03K 19/20* (2013.01); *H03L 7/08* (2013.01); *H03K 2005/0015* (2013.01)

(58) Field of Classification Search
CPC .. H03L 7/07; H03L 7/08; H03K 5/135; H03K 19/20; H03K 2005/0015
See application file for complete search history.

(56) References Cited

U.S. PATENT DOCUMENTS

| | | | |
|---|---|---|---|
| 6,600,345 B1 * | 7/2003 | Boutaud | G06F 1/08 327/294 |
| 6,686,785 B2 | 2/2004 | Liu et al. | |
| 2002/0079937 A1 | 6/2002 | Xanthopoulos | |
| 2012/0068748 A1 | 3/2012 | Stojanovic et al. | |
| 2013/0238309 A1 | 9/2013 | Ting et al. | |

(Continued)

OTHER PUBLICATIONS

Senger, et al., "Low-Latency, HDL-Synthesizable Dynamic Clock Frequency Controller with Self-Referenced Hybrid Clocking," IEEE, ISCAS 2006.

(Continued)

*Primary Examiner* — Daniel C Puentes
(74) *Attorney, Agent, or Firm* — Hamilton, Brook, Smith & Reynolds, P.C.

(57) ABSTRACT

A circuit and corresponding method enable glitch-free frequency. The circuit comprises a first delay circuit and a second delay circuit, configured to produce first and second propagated enables, respectively, from first and second input enables, respectively; and an output clock circuit. The output clock circuit is configured to produce an output clock that switches, glitch-free, between a first phase-locked clock and a second phase-locked. The first and second delay circuits are further configured to enable the output clock to be switched, glitch-free, by employing the second propagated enable to gate propagation of the first input enable and the first propagated enable to gate propagation of the second input enable, respectively. The first and second input enables are configured to be enabled, alternately, causing the output clock to switch between the first and second phase-locked clocks.

22 Claims, 12 Drawing Sheets

(56) References Cited

U.S. PATENT DOCUMENTS

2014/0347107 A1    11/2014   Kim
2016/0077572 A1    3/2016   Chang

OTHER PUBLICATIONS

Zoni, et al., "A DVFS Cycle Accurate Simulation Framework with Asynchronous NoC Design for Power-Performance Optimizations," J. Sign. Process Syst., published online Mar. 24, 2015.
Sidiropoulos, et al., "A Semidigital Dual Delay-Locked Loop," IEEE Journal of Solid-State Circuits, vol. 32, No. 11, Nov. 1997.

\* cited by examiner

GLITCH-FREE PLL MULTIPLEXER

RELATED APPLICATION

This application claims the benefit of U.S. Provisional Application No. 62/770,293, filed on Nov. 21, 2018. The entire teachings of the above application are incorporated herein by reference.

BACKGROUND

Hardware components, such as processors, may dynamically alter their frequency to balance performance and power consumption. Running at a lower frequency may reduce power consumption at a cost to performance, while running at a higher frequency may increase performance but consume more power. The ability to dynamically scale processor clock frequency and power supply voltage with workload is a useful technique for reducing active and standby power consumption in nanoscale embedded systems and other applications. This dynamic adjustment is commonly known as Dynamic Frequency Scaling (DFS) or Dynamic Voltage Frequency Scaling (DVFS).

DVFS has been used successfully to reduce power in many applications, such as portable embedded applications (e.g., PDAs and cell phones) and other applications. DVFS circuits may be implemented with a phase-lock loop (PLL) that may be used to multiply a low frequency reference signal that is typically derived from an external crystal oscillator. A PLL prescaler can be changed to generate a new clock frequency to dynamical scale the processor clock frequency.

SUMMARY

According to an example embodiment, a glitch-free phase-locked loop (PLL) multiplexer circuit may comprise a first delay circuit and a second delay circuit, configured to produce first and second propagated enables, respectively, from first and second input enables, respectively, and an output clock circuit. The output clock circuit may be configured to produce an output clock that switches, glitch-free, between a first phase-locked clock and a second phase-locked clock. The first and second delay circuits may be further configured to enable the output clock to be switched, glitch-free, by employing the second propagated enable to gate propagation of the first input enable and by employing the first propagated enable to gate propagation of the second input enable, respectively. The first and second input enables may be configured to be enabled, alternately, causing the output clock to switch between the first and second phase-locked clocks.

The output clock circuit may be further configured to produce (i) a first gated clock by combining the first propagated enable with the first phase-locked clock, (ii) a second gated clock by combining the second propagated enable with the second phase-locked clock, and (iii) the output clock as a function of the first and second gated clocks.

The output clock circuit may include a first AND gate, configured to produce the first gated clock by performing a logical AND of the first propagated enable with the first phase-locked clock. The output clock circuit may include a second AND gate, configured to produce the second gated clock by performing a logical AND of the second propagated enable with the second phase-locked clock. The output clock circuit may include an OR gate, configured to produce the output clock by performing a logical OR of the first and second gated clocks.

The glitch-free PLL multiplexer circuit may further comprise a selection decoder circuit configured to produce the first and second input enables by decoding a first selector and a second selector.

The selection decoder circuit may include an inverter configured to produce an inverted first selector by inverting the first selector. The selection decoder circuit may include a first AND gate configured to produce the first input enable by performing a logical AND of the inverted first selector and the second selector. The selection decoder circuit may include a second AND gate configured to produce the second input enable by performing a logical AND of the first selector and the second selector.

The first delay circuit may include a first D-latch, configured to receive the first input enable at its D-input and enabled by the second propagated enable, and a first multi-flop synchronizer, the first multi-flop synchronizer configured to receive a first Q-output of the first D-latch and configured to output the first propagated enable. The second delay circuit may include a second D-latch, configured to receive the second input enable at its D-input and enabled by the first propagated enable, and a second multi-flop synchronizer, the second multi-flop synchronizer configured to receive a second Q-output of the second D-latch and configured to output the second propagated enable. The first D-latch may be configured to be opened and closed by a low level and a high level of the second propagated enable, respectively, and the second D-latch may be configured to be opened and closed by a low level and a high level of the first propagated enable, respectively.

The first multi-flop synchronizer may include a first resettable flip-flop (FF) cascaded with a second resettable FF, the first and second resettable FFs clocked by the first phase-locked clock and configured to be reset via a first synchronizer reset. The second multi-flop synchronizer may include a third resettable FF cascaded with a fourth resettable FF, the third and fourth resettable FFs clocked by the second phase-locked clock and configured to be reset via a second synchronizer reset. The first and second resettable FFs may be clocked on a negative edge of the first phase-locked clock and the third and fourth resettable FFs may be clocked on a negative edge of the second phase-locked clock.

The glitch-free multiplexer circuit may further comprise a first PLL configured to produce the first phase-locked clock and a second PLL configured to produce the second phase-locked clock.

Respective phases and frequencies of the first and second phase-locked clocks may be independent of one another.

The glitch-free multiplexer circuit may enable the output clock to switch, glitch-free, from the first phase-locked clock to the second phase-locked clock within 1-2 cycles of a frequency of the second phase-locked clock.

According to another example embodiment, a method for glitch-free frequency switching of a phase-locked loop (PLL) multiplexer circuit may comprise producing a first propagated enable from a first input enable and a second propagated enable from a second input enable; producing an output clock that switches between a first phase-locked clock and a second phase-locked clock; and switching the output clock, glitch-free, between the first and second phase-locked clocks by employing the second propagated enable to gate propagation of the first input enable and by employing the first propagated enable to gate propagation of the second input enable. The switching may include enabling the first and second input enables, alternately, causing the output clock to switch between the first and second phase-locked clocks.

Alternative method embodiments parallel those described above in connection with the example circuit embodiments.

It should be understood that example embodiments disclosed herein can be implemented in the form of a method, apparatus, system, or computer readable medium with program codes embodied thereon.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Dynamic Voltage Frequency Scaling (DVFS) is a common power management technique in high-performance processors. One method to scale the frequency is a dual phase-locked loop (PLL) architecture that uses a first phase-locked clock of one PLL to drive a system clock while the second PLL is locking to a new (i.e., different) frequency. Once the second PLL is locked to the new frequency, the system clock can be switched to the phase-locked clock of the second PLL. Switching between the two PLLs, that is, switching between the two phase-locked clocks of the PLLs can, however, introduce glitches, that is, truncated pulses of short duration, on the system clock, causing functional failures. Such truncated pulses have pulse widths that are truncated relative to respective pulse widths of multiple clocks for which the system clock is configured to switch between. According to an example embodiment, such switching between the multiple clocks is configured to be "glitch-free," that is, free of any such truncated pulses.

According to an example embodiment, switching between the respective phase-locked clocks of two PLLs can be performed via a glitch-free PLL multiplexer. According to the example embodiment, the glitch-free PLL multiplexer does not require any phase or frequency relationship between the respective phase-locked clocks of the two PLLs to achieve glitch-free switching. The glitch-free PLL multiplexer can achieve switching from a phase-locked clock of one PLL (PLL0) to a phase-locked clock of a second PLL (PLL1) within 1-2 cycles of a frequency of the second PLL's phase-locked clock. In the example embodiment, a first enable (en0) for enabling, that is, for selecting the first PLL's (PLL0's) phase-locked clock, is used to gate propagation of a second enable (en1) for enabling, that is, selecting the second PLL's (PLL1's) phase-locked clock and vice-versa, ensuring glitch-free operation for all frequency steps (i.e., increments), as disclosed below.

Figure 1:
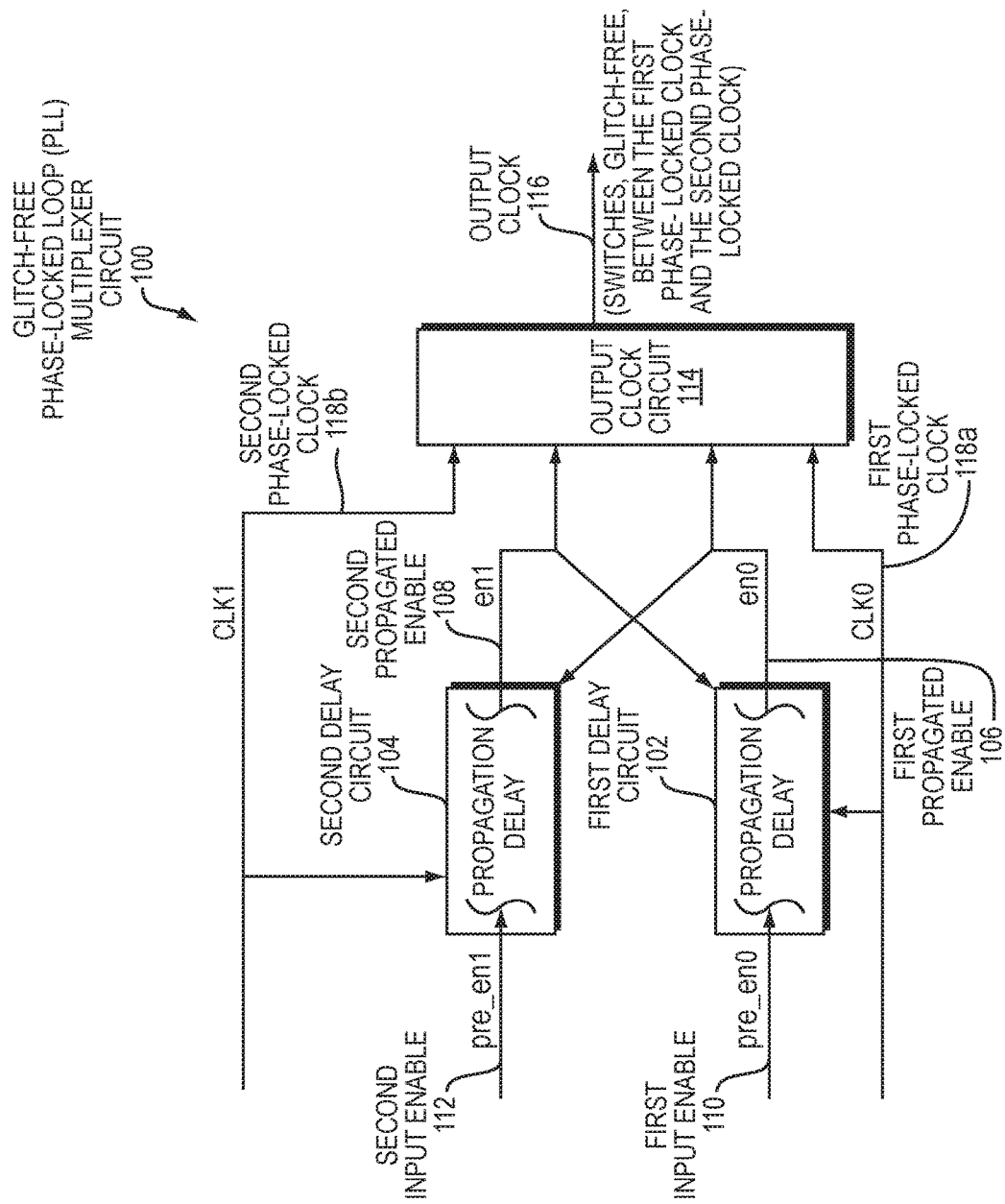
FIG. 1 is a block diagram of an example embodiment of a glitch-free phase-locked loop (PLL) multiplexer circuit.

FIG. 1 is a block diagram of an example embodiment of a glitch-free phase-locked loop (PLL) multiplexer circuit 100. The glitch-free PLL multiplexer circuit 100 may be referred to as a "PLL multiplexer" because it switches an output clock 116 between phase-locked clocks of multiple PLLs (not shown), namely, between a first phase-locked clock 118a of a first PLL (not shown) and a second phase-locked clock 118b of a second PLL (not shown). Such switching is performed glitch-free. While the glitch-free PLL multiplexer circuit 100 may switch the output clock 116 between such phase-locked clocks, glitch-free, the output clock 116 may also be configured such that it does not switch at all and remains at a fixed level, such as a low level '0' or a high level '1.' According to the example embodiment, the glitch-free PLL multiplexer circuit 100 comprises: a first delay circuit 102 and a second delay circuit 104, configured to produce first and second propagated enables (i.e., a first propagated enable 106 and a second propagated enable 108), respectively, from first and second input enables (i.e., a first input enable 110 and a second input enable 112), respectively; and an output clock circuit 114.

The output clock circuit 114 is configured to produce an output clock 116 that switches, glitch-free, between the first phased-locked clock 118a and the second phase-locked clock 118b. The first delay circuit 102 and the second delay circuit 104 are further configured to enable the output clock 116 to be switched, glitch-free, by employing the second propagated enable 108 to gate propagation of the first input enable 110 and by employing the first propagated enable 106 to gate propagation of the second input enable 112, respectively. The first input enable 110 and the second input enable 112 are configured to be enabled, alternately, causing the output clock 116 to switch between the first phase-locked clock 118a and the second phase-locked clock 118b.

For example, the first input enable 110 and the second input enable 112 are not enabled concurrently. Rather, which input enable (of the first input enable 110 and second input enable 112) is enabled alternates and a single input enable of the first input enable 110 and second input enable 112 is enabled at any given time. The first input enable 110 and the second input enable 112 may be enabled, successively, causing the output clock to switch, successively, from the first phase-locked clock 118a to the second phase-locked clock 118b. Such successive switching may be performed by successively selecting PLLs, such as by selecting, successively, the PLL0 252a and PLL1 252b via the first selector 227 (i.e., pll_sel[0]) and the second selector 229 (i.e., pll_sel[1]) of FIG. 2, disclosed below.

The output clock circuit 114 is further configured to produce (i) a first gated clock (not shown) by combining the first propagated enable 106 with the first phase-locked clock 118a, (ii) a second gated clock (not shown) by combining the second propagated enable 108 with the second phase-locked clock 118b, and (iii) the output clock 116 as a function of the first and second gated clocks, as disclosed below.

Figure 2:
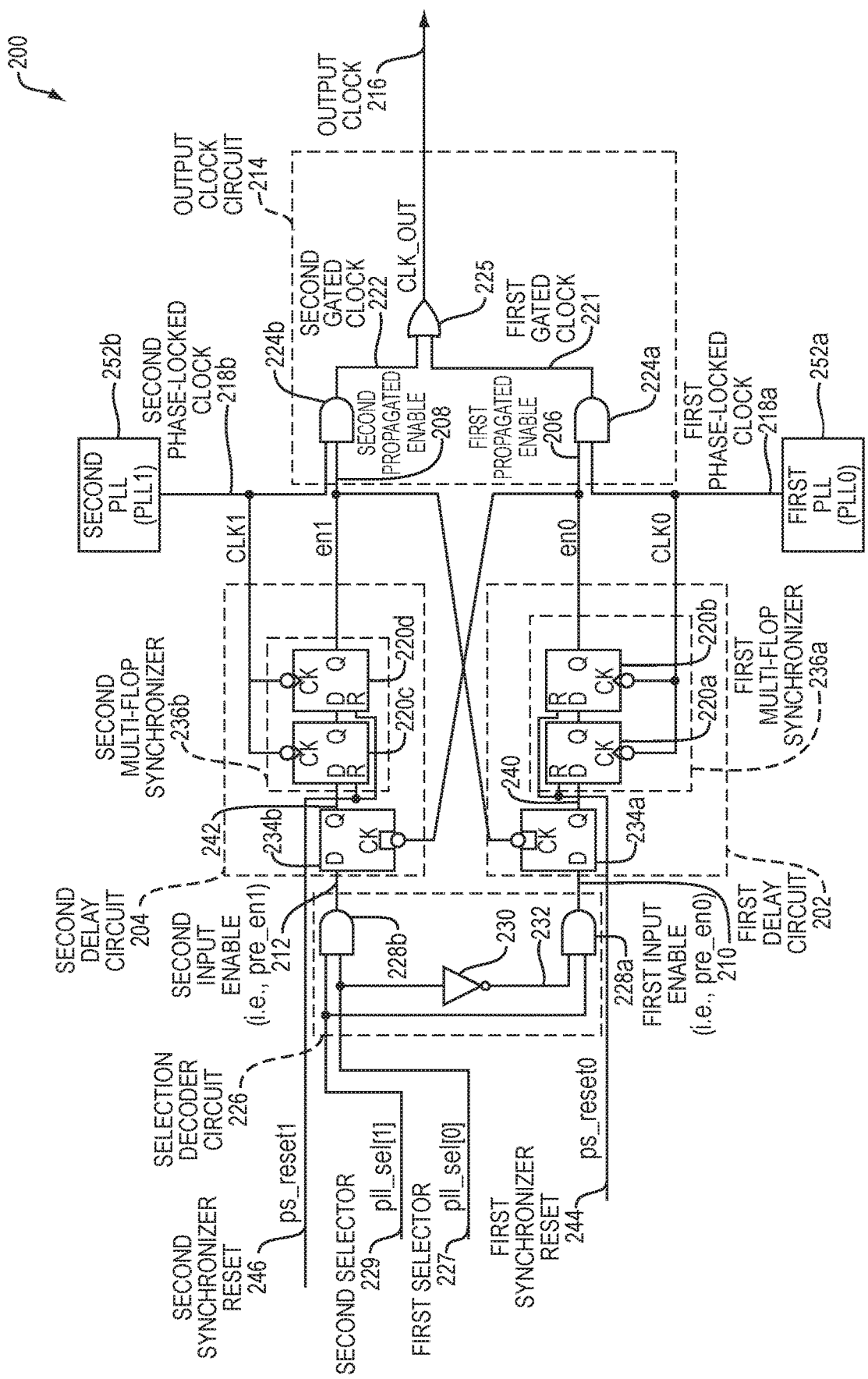
FIG. 2 is a circuit diagram of an example embodiment of the glitch-free phase-locked loop (PLL) multiplexer circuit of FIG. 1.

FIG. 2 is a circuit diagram of an example embodiment of a glitch-free PLL multiplexer circuit 200 that may be employed as the glitch-free PLL multiplexer circuit 100, disclosed above. It should be understood that the arrangements of circuitry of the glitch-free multiplexer circuit 200 may be implemented via equivalents thereof.

According to the example embodiment of FIG. 2, the glitch-free phase-locked loop (PLL) multiplexer circuit 200 comprises: a first delay circuit 202 and a second delay circuit 204, configured to produce first and second propagated enables (i.e., a first propagated enable 206 and a second propagated enable 208), respectively, from first and second input enables (i.e., a first input enable 210 and a second input enable 212) respectively; and an output clock circuit 214.

The output clock circuit 214 is configured to produce an output clock 216 that switches, glitch-free, between a first phased-locked clock 218a and a second phase-locked clock 218b. The first delay circuit 202 and the second delay circuit 204 are further configured to enable the output clock 216 to be switched, glitch-free, by employing the second propagated enable 208 to gate propagation of the first input enable 210 and by employing the first propagated enable 206 to gate propagation of the second input enable 212, respectively.

The output clock circuit 216 is further configured to produce (i) a first gated clock 221 by combining the first propagated enable 206 (i.e., en0) with the first phase-locked clock 218a, (ii) a second gated clock 222 by combining the second propagated enable 208 (i.e., en1) with the second phase-locked clock 218b, and (iii) the output clock 216 as a function of the first gated clock 221 and the second gated clock 222.

The output clock circuit includes a first AND gate 224a, configured to produce the first gated clock 221 by performing a logical AND of the first propagated enable 206 (i.e., en0) with the first phase-locked clock 218a; a second AND gate 224b, configured to produce the second gated clock 222 by performing a logical AND of the second propagated enable 208 (i.e., en01) with the second phase-locked clock 218b; and an OR gate 225, configured to produce the output clock 216 by performing a logical OR of the first gated clock 221 and the second gated clock 222.

As disclosed above, it should be understood that the arrangements of circuitry of the glitch-free multiplexer circuit 200 may be implemented via equivalents thereof. For example, alternatively, the first and second AND gates, that is, the first AND gate 224a and the second AND gate 224b, may be implemented as NAND gates in combination with the OR gate 225 implemented as a negative-OR gate.

The circuit 200 further comprises a selection decoder circuit 226 configured to produce the first input enable 210 and the second input enable 212 by decoding a first selector 227 and a second selector 229. The selection decoder circuit includes: an inverter 230 configured to produce an inverted first selector 232 by inverting the first selector 227 (i.e., pll_sel[0]); a first AND gate 228a configured to produce the first input enable 210 (i.e., pre_en0) by performing a logical AND of the inverted first selector 232 and the second selector 229 (i.e., pll_sel[1]); and a second AND gate 228b configured to produce the second input enable 212 (i.e., pre_en1) by performing a logical AND of the first selector 227 (i.e., pll_sel[0]) and the second selector 229 (i.e., pll_sel[1]).

The first delay circuit 202 includes: a first D-latch 234a, configured to receive the first input enable 210 (i.e., pre_en0) at its D-input and enabled by the second propagated enable 208 (i.e., en1); and a first multi-flop synchronizer 236a, the first multi-flop synchronizer 236a configured to receive a first Q-output 240 of the first D-latch 234a and configured to output the first propagated enable 206 (i.e., en0).

The second delay circuit 204 includes: a second D-latch 234b, configured to receive the second input enable 212 (i.e., pre_en1) at its D-input and enabled by the first propagated enable 206 (i.e., en0); and a second multi-flop synchronizer 236b, the second multi-flop synchronizer 236b configured to receive a second Q-output 242 of the second D-latch 234b and configured to output the second propagated enable 208 (i.e., en1).

According to an example embodiment, the first D-latch 234a is configured to be open based on a low level (i.e., '0') of the second propagated enable 208 (i.e., en1) and closed based on a high level (i.e., '1') of the second propagated enable 208 (i.e., en1). The second D-latch 234b is configured to be opened based on a low level (i.e., '0') of the first propagated enable 206 (i.e., en0) and closed based on a high level (i.e., '1') of the first propagated enable 206 (i.e., en0).

For example, when the second propagated enable 208 (i.e., en1) is at the low level, the first D-latch 234a is "open," that is, the Q-output 240 of the first D-latch 234a follows its D-input, whereas, when the second propagated enable 208 (i.e., en1) is at the high level, the first D-latch 234a is "closed," that is, the Q-output 240 of the first D-latch 234a retains its last value independent of a value of its D-input, that is, independent of a value of the first input enable 210 (i.e., pre_en0).

Similarly, when the first propagated enable 206 (i.e., en0) is at the low level, the second D-latch 234b is "open," that is, the Q-output 242 of the second D-latch 234b follows its D-input, whereas, when the first propagated enable 206 (i.e., en0) is at the high level, the second D-latch 234b is "closed," that is, the Q-output 242 of the second D-latch 234b retains its last value independent of a value of its D-input, that is, independent of a value of the second input enable 212 (i.e., pre_en1).

It should be understood that a "low level" and "high level" may be based on a supply voltage for powering the circuit 200. The "low level" may be referred to interchangeably herein as a first level and the "high level" may be referred to interchangeably herein as a second level, wherein the first level is lower relative to the second level. For example, the first level, that is, the low level, may be the circuit's ground point and the second level, that is, the high level, may be the voltage supply input to the circuit, such as 3V or 5V, or any other suitable voltage. It should be understood that the low level and high level may be any suitable voltage levels for which the low level is low relative to the high level.

Turning back to FIG. 2, the first multi-flop synchronizer 236a includes a first resettable FF 220a cascaded with a second resettable FF 220b, the first and second resettable FFs clocked by the first phase-locked clock 218a and configured to be reset via a first synchronizer reset 244, that is, ps_reset0. The second multi-flop synchronizer 236b includes a third resettable FF 220c cascaded with a fourth resettable FF 220d, the third and fourth resettable FFs clocked by the second phase-locked clock 218b and configured to be reset via a second synchronizer reset 246, that is, ps_reset1.

It should be understood that the FFs differ from the D-latches, that is, the first D-latch 234a and the second D-latch 234b, in that the latches are asynchronous with outputs that can change as soon as or after a small propagation delay, so long as the latch is enabled (i.e., open). The resettable FFs differ from the latches as they are edge-triggered and the outputs only change state when not in reset and an input clock transitions. According to an example embodiment, the first multi-flop synchronizer 236a is clocked on a negative edge of the first phase-locked clock 218a, for example, the first and second resettable FFs are clocked on the negative edge of the first phase-locked clock 218a. Similarly, according to an example embodiment, the second multi-flop synchronizer 236b is clocked on a negative edge of the second phase-locked clock 218b. As such, the third and fourth resettable FFs are clocked on the negative edge of the second phase-locked clock 218b.

The circuit 200 further comprises a first PLL 252a configured to produce the first phase-locked clock 218a and a second PLL 252b configured to produce the second phase-locked clock 218b. Respective phases and frequencies of the first phase-locked clock 218a and the second phase-locked clock 218b are independent of one another, that is, there is no requirement that there be any relationship relative thereto in order for the circuit 200 to switch the output clock 216, glitch-free.

The first PLL 252a and second PLL 252b may be any suitable PLLs, such as a prior art PLL 352, disclosed below with regard to FIG. 3. It should be understood that while the prior art PLL 352, disclosed below, is an integer-N PLL, the first PLL 252a or the second PLL 252b may be fractional-N PLLs, or a combination of integer-N and fractional-N PLLs. Further, elements of the PLL 252a and second PLL 252b are not limited to elements of the prior art PLL 352, disclosed below with regard to FIG. 3.

Figure 3:
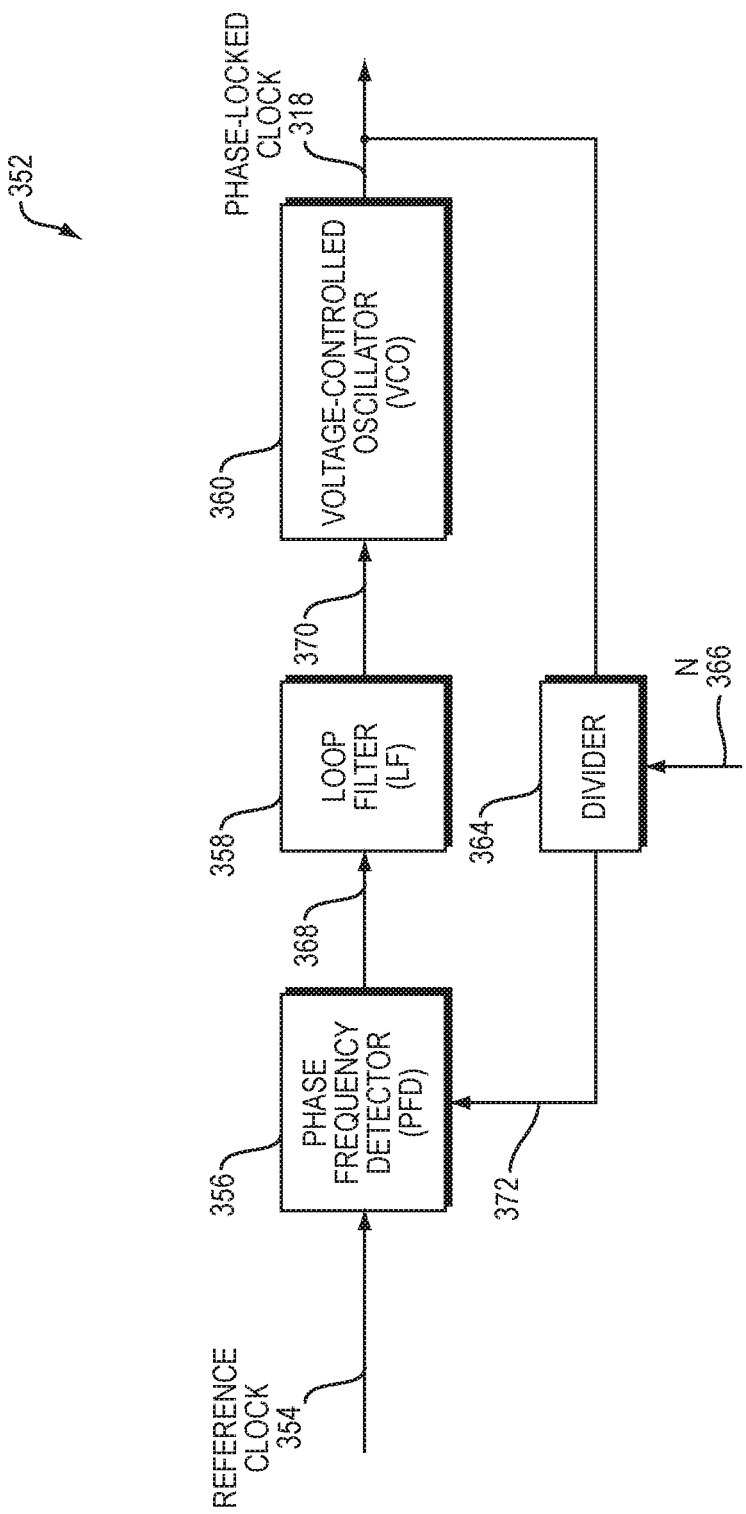
FIG. 3 is a block diagram of an example embodiment of a prior art PLL.

FIG. 3 is a block diagram of an example embodiment of a prior art PLL 352. The PLL 352 includes a number of elements, including (but not limited to) a voltage controlled oscillator (VCO) 360, feedback divider 364, phase frequency detector (PFD) 356, and loop filter (LF) 358. The PLL 352 takes in an input reference clock 354 and compares it to a phase of the divided down VCO output 372 at the PFD 356. An error signal 368 at the output of the PFD 356 is filtered by the LF 358 to produce a filtered output 370 that may be used to control the VCO 360 that generates a phase-locked clock 318 with a corresponding frequency that may depend on a control voltage of the filtered output 370.

The LF 358 may be any suitable type of loop filter, such as an integrating loop filter, and the PFD 356 may include a charge-pump (not shown). The corresponding frequency of the phase-locked clock 318 may be configured to be $F_{out}=N*F_{ref}$ where N is an integer value, such as the integer N 366 that may be combined and input to the divider 364. As such, the PLL 352 may be referred to as an integer PLL or integer-N PLL. A reset block (not shown) may be employed to reset the PLL 352.

Alternatively, a pre-scaler R (not shown) may be configured to divide down the reference clock 354 and a post-scaler P (not shown) may be configured to divide down the corresponding frequency of the phase-locked clock 318. As such, the resulting frequency of the phase-locked clock 318 may instead be $F_{out}=N*F_{ref}/(R*P)$ so that some fractional values may be obtained. As such, the PLL 352 may be configured to be a fractional PLL and referred to as a frac-N PLL.

Figure 4A:
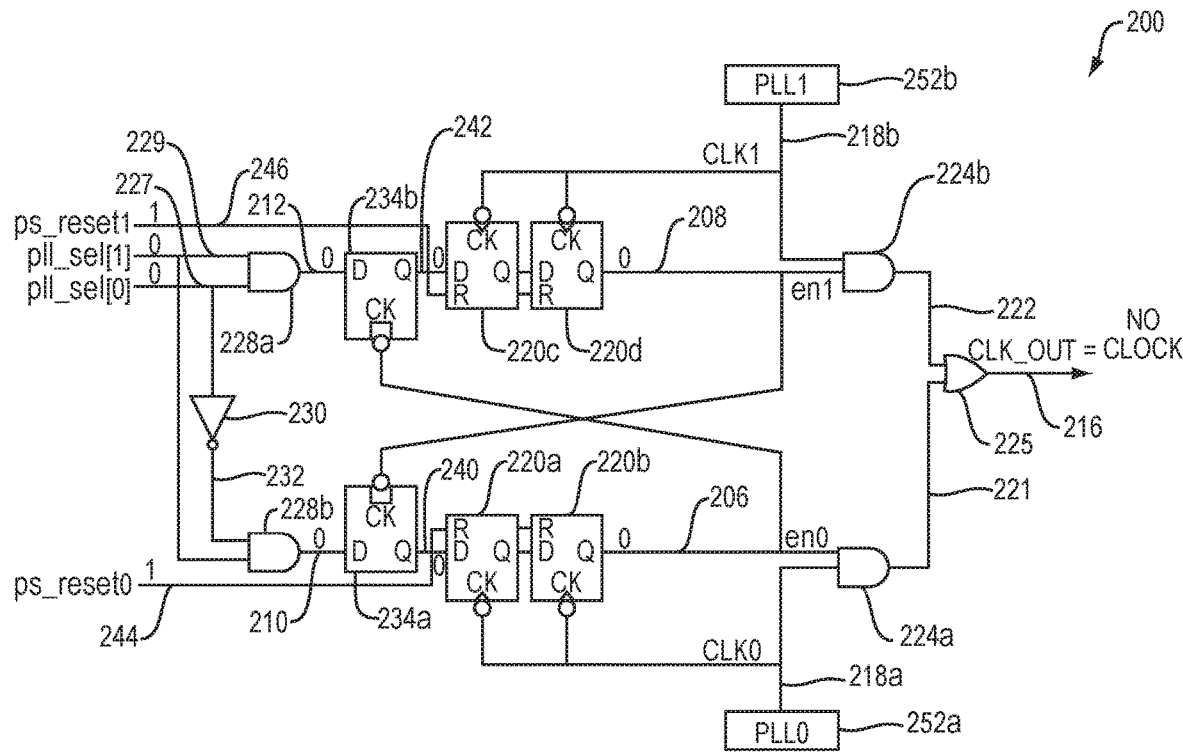
FIGS. 4A-M are circuit diagrams of the example embodiment of the glitch-free PLL multiplexer circuit of FIG. 2 with respective stages for an example embodiment of a sequence of operation.

FIGS. 4A-N are circuit diagrams of the example embodiment of the glitch-free PLL multiplexer circuit 200 of FIG. 2, disclosed above, with respective stages for an example embodiment of a sequence of operation that switches the output clock 216 between the phase-locked clock 218a of the first PLL 252a and the phase-locked clock 218b of the second PLL 252b. In the example embodiment of the sequence of operation, the sequence begins as disclosed in FIG. 4A, with a first stage of operation (also referred to interchangeable herein as an A-stage of operation).

The sequence of operation transitions from the A-stage through the B-M stages, as disclosed below with regard to FIGS. B-M, respectively. In the first stage, that is, in the A-stage, the first synchronizer reset 244 (i.e., ps_reset0) and the second synchronizer reset 246 (i.e., ps_reset1) are configured to be '1' and the first selector 227 (i.e., pll_sel[0]) and the second selector 229 (i.e., pll_sel[1]) are configured to be '0.' As a result, the output clock 216 (i.e., CLK_OUT) is at '0' and neither the first PLL 252a (also referred to interchangeably herein as PLL0) nor the second PLL 252b (also referred to interchangeably herein as PLL1) are selected, that is, neither the first phase-locked clock 218a nor the second phase-locked clock 218b are selected for being output as the output clock 216 (i.e., CLK_OUT).

The sequence of operation then changes the first synchronizer reset 244 (i.e., ps_reset0) and the second synchronizer reset 246 (i.e., ps_reset1) from '1' to '0,' either simultaneously or in any order, releasing the first multi-flop synchronizer 236a and second multi-flop synchronizer 236b from reset in the B-stage. In the C-stage, the pll_sel[1:0] is changed from '00' to '10,' thus, selecting PLL0 for output as the output clock 216 and such selection, is reflected at that output clock 216 in the E- and F-stages. In the G-stage, the pll_sel[1:0] is changed from '10' to '11,' thus, selecting PLL1 for output as the output clock 216 and such selection, is reflected at the output clock 216 in the L- and M-stages. It should be understood that while a switch of the output clock 216 from the PLL0 to the PLL1 may be shown via multiple stages that disclose propagation of changes to signal levels for illustration, such multiple stages are not required and such changes of signal levels may occur in a same clock cycle. The sequence of operation may keep toggling, such as by changing the pll_sel[1:0] back to '10' following the M-stage to again select the PLL0 and so forth. Further detail regarding each of the stages is disclosed below.

In the A-stage of operation, the first selector 227 (i.e., pll_sel[0]) and the second selector 229 (i.e., pll_sel[1]) are configured as pll_sel[1:0]='00' such that the selection decoder circuit 226, as disclosed above with regard to FIG. 2, decodes the first input enable 210 to be '0' and the second input enable 212 to be 0. Further, the first synchronizer reset 244 (i.e., ps_reset0) and the second synchronizer reset 246 (i.e., ps_reset1) are both configured to be '1,' causing the second resettable FF 220b the fourth resettable FF 220d to output '0,' causing the first propagated enable 206 (i.e., en0) and the second propagated enable 208 (i.e., en1) to be '0' and, thus, causing the output clock 216 (i.e., CLK_OUT) to be 0. As such, the output clock 216 (i.e., CLK_OUT) does not clock in the A-stage of operation.

Moreover, as the first D-latch 234a and second D-latch 234b are open, since the second propagated enable 208 is at '0' (i.e., low level) and the first propagated enable 206 is at '0' (i.e., low level), respectively, the first D-latch 234a and second D-latch 234b pass through the value of '0' of the first input enable 210 and the value of '0' of the second input enable 212, respectively, causing the first Q-output 240 of the first D-latch 234a and the second Q-output 242 of the second D-latch 234b to both be '0' in the A-stage.

Figure 4B:
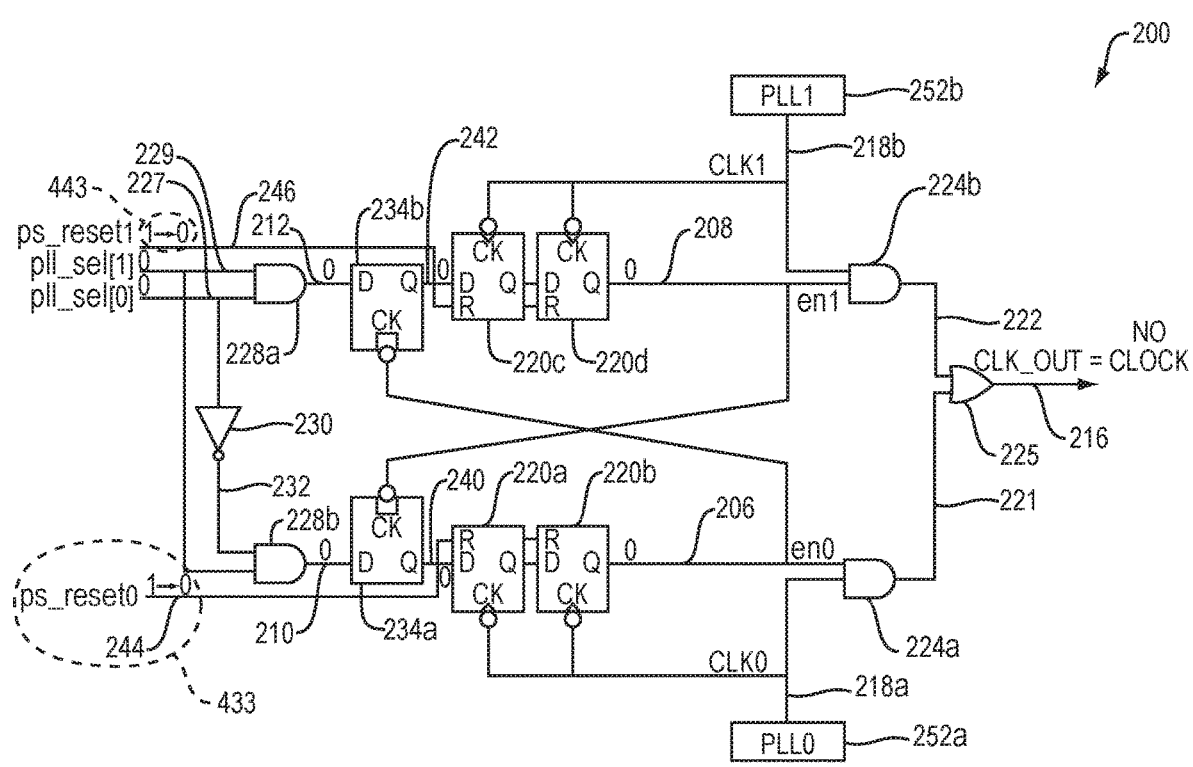
Figure 4C:
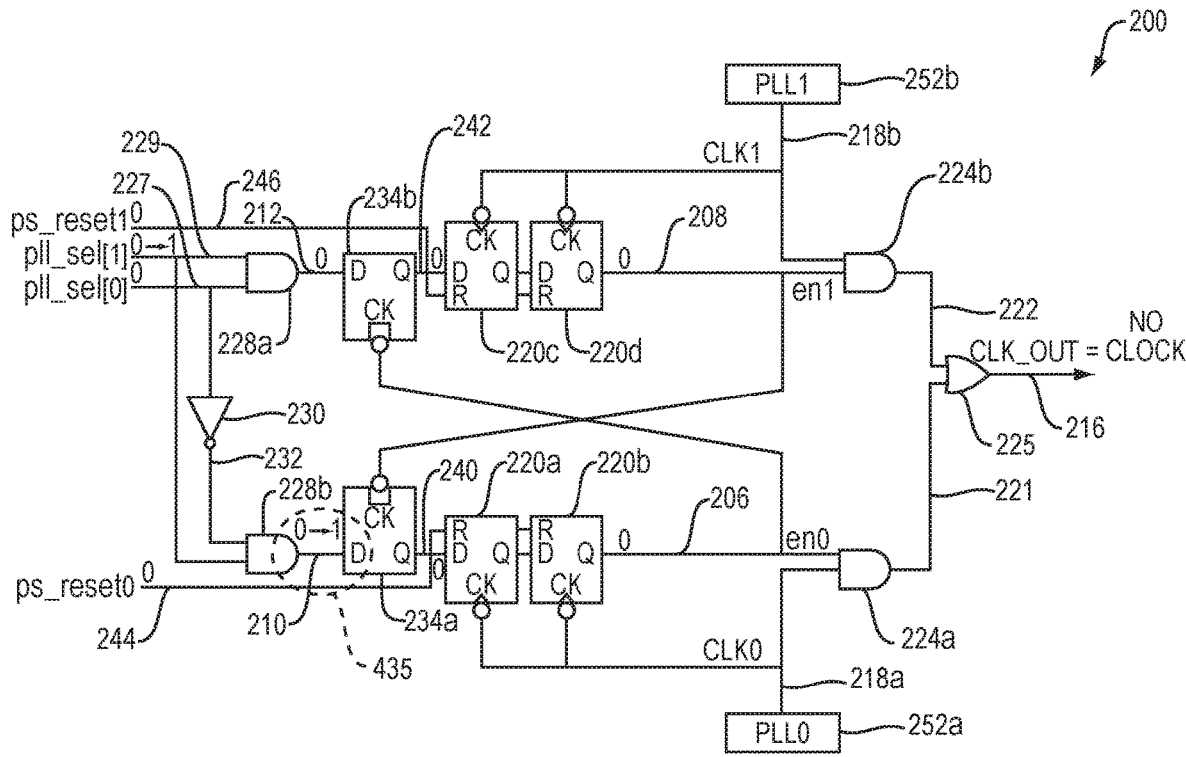

In the example embodiment of the sequence of operation, the sequence transitions from the A-stage of operation, disclosed in FIG. 4A, to a B-stage of operation disclosed in FIG. 4B. In the B-stage, the first synchronizer reset 244 (i.e., ps_reset0) transitions 433 from '1' to '0,' releasing the first multi-flop synchronizer 236, disclosed above with regard to FIG. 2, from reset. As such, the first resettable FF 220a and the second resettable FF 220b are released from reset and latch values from their respective D-inputs to their respective Q-outputs on negative (i.e., falling) edges of the first phase-locked clock 218a. Since the first input enable 210 is still at '0,' such latched values remain at '0' until the B-stage of operation transitions to a C-stage of operation disclosed below with regard to FIG. 4C. Further in the B-stage of operation, the second synchronizer reset 246 (i.e., ps_reset1) transitions 443 from '1' to '0,' releasing the second multi-flop synchronizer 236b, disclosed above with regard to FIG. 2, from reset. As such, the third resettable FF 220c and the fourth resettable FF 220d are released from reset and latch values from their respective D-inputs to their respective Q-outputs on negative (i.e., falling) edges of the second phase-locked clock 218b. Since the second input enable 212 is still at '0,' such latched values remain at '0' causing the second propagated enable 208 (i.e., en1) to be at '0.' As such, in the B-stage, the first propagated enable 206 (i.e., en0) and the second propagated enable 208 (i.e., en1) continue to be '0' and, thus, the output clock 216 (i.e., CLK_OUT) does not clock in the B-stage of operation.

Figure 4D:
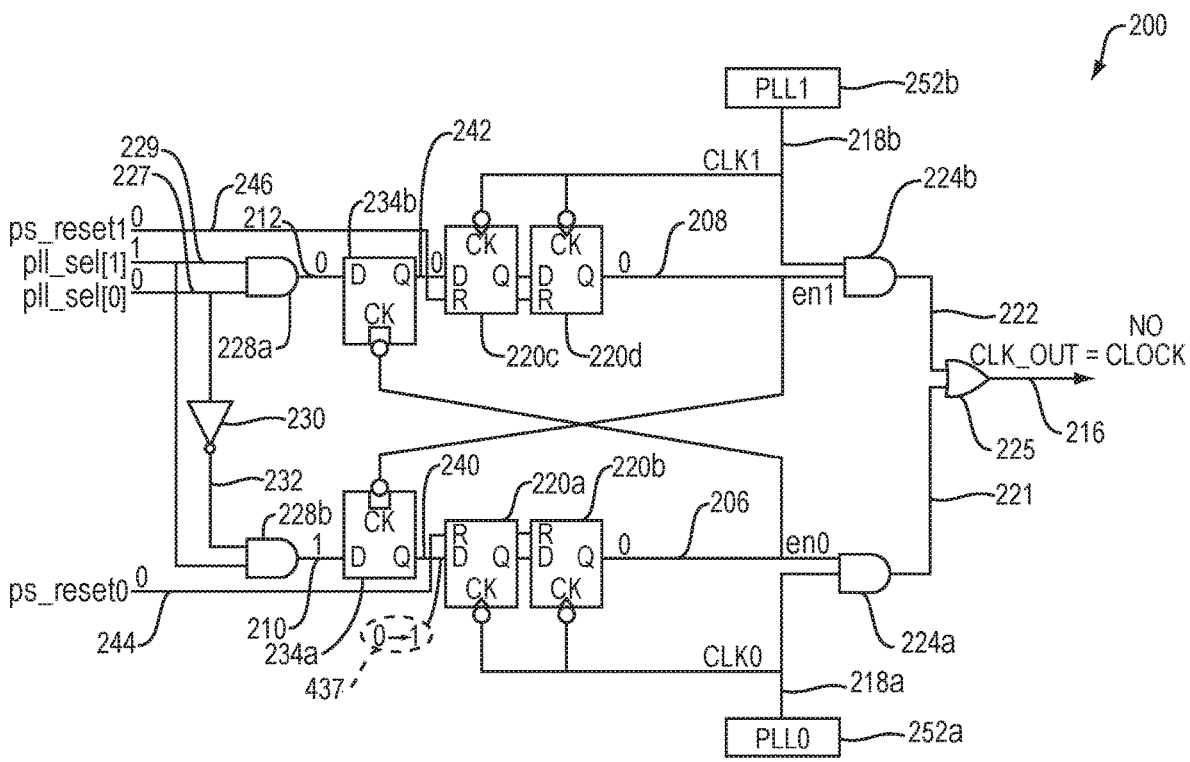

In the C-stage of operation, the first selector 227 (i.e., pll_sel[0]) and the second selector 229 (i.e., pll_sel[1]) are configured as pll_sel[1:0]='10,' that is, PLL0 is selected, and the selection decoder circuit 226, as disclosed above with regard to FIG. 2, decodes the first input enable 210 to be '1' and the second input enable to be 212 to be '0' and, thus, the first input enable 210 transitions 435 from '0' to '1' and the second input enable remains at 0. Since the first D-latch 234 is open, the first D-latch 234 passes the first input enable 210 value of '1' through to the first Q-output 240. As such, the first Q-output 240 transitions 437 from '0' to '1' in a D-stage of operation disclosed in FIG. 4D. In the D-stage, the first enable 210's value of '1' has not yet propagated to the first propagated enable 206. In both the C- and D-stages, the first propagated enable 206 (i.e., en0) and the second propagated enable 208 (i.e., en1) continue to be '0' and, thus, the output clock 216 (i.e., CLK_OUT) does not clock in the C- and D-stages.

Figure 4E:
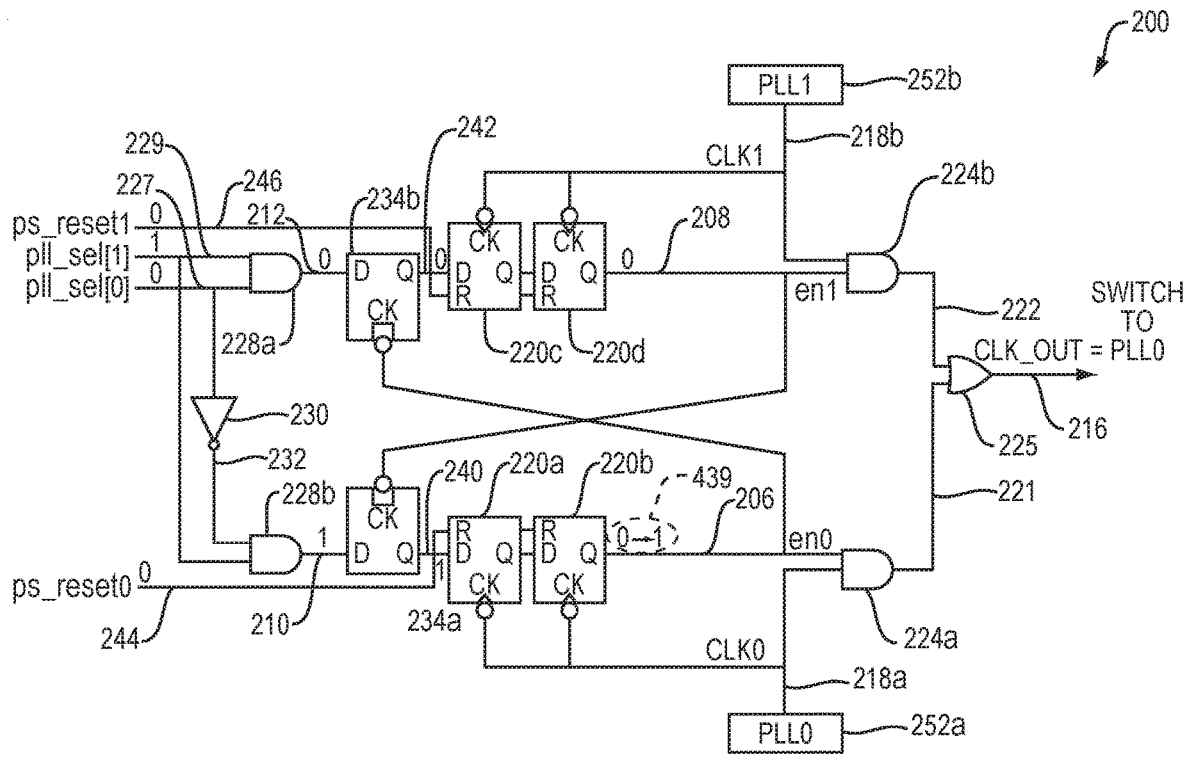

Since the first multi-flop synchronizer 236a remains enabled, that is, released from reset, as disclosed above with regard to the B-stage, the first resettable FF 220a and the second resettable FF 220b both latch values from their respective D-inputs to their respective Q-outputs on negative (i.e., falling) edges of the first phase-locked clock 218a, causing the first multi-flop synchronizer 236a to transition 439 the first propagated enable 206 from '0' to '1' on a negative edge of the first phase-locked clock 218a in an E-stage, as disclosed in FIG. 4E.

In the E-stage, a value '1' of the first input enable 210 has propagated to the first propagated enable 206, thus, causing the first gated clock 221 to be the first phased-locked clock 218a output from the first PLL 252a. Since the second propagated enable 208 is '0,' the second gated clock 222 is at '1' and does not clock, the output clock 216 (i.e., CLK_OUT) from the OR gate 225 switches, glitch free, from being at '0' the first phase-locked clock 218a.

Figure 4F:
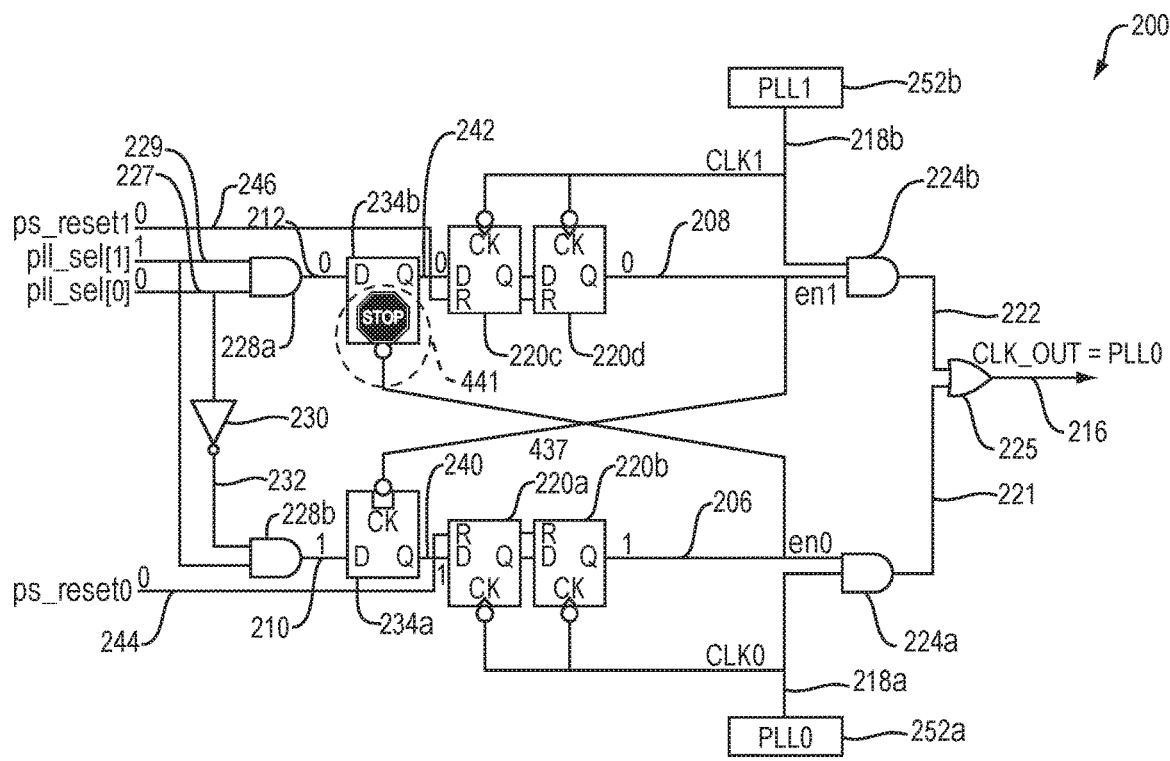

Further, in the E-stage, the value of '1' of the first input enable 210 that has propagated to the first propagated enable 206 in the E-stage causes the second D-latch 234b to transition from being open to being closed, as disclosed with regard to an F-stage of FIG. 4F. In the F-stage, the second D-latch 234b has transitioned from being open to being closed 441, that is, from being enabled to being disabled. As such, the second D-latch 234b retains its '0' value on the second Q-output 242, regardless of a value of the second input enable 212. Thus, the first propagated enable 206 gates (i.e., blocks) propagation of the second input enable 212 in the F-stage, and the output clock 216 (i.e., CLK_OUT) continues as the first phase-locked clock 218a.

Figure 4G:
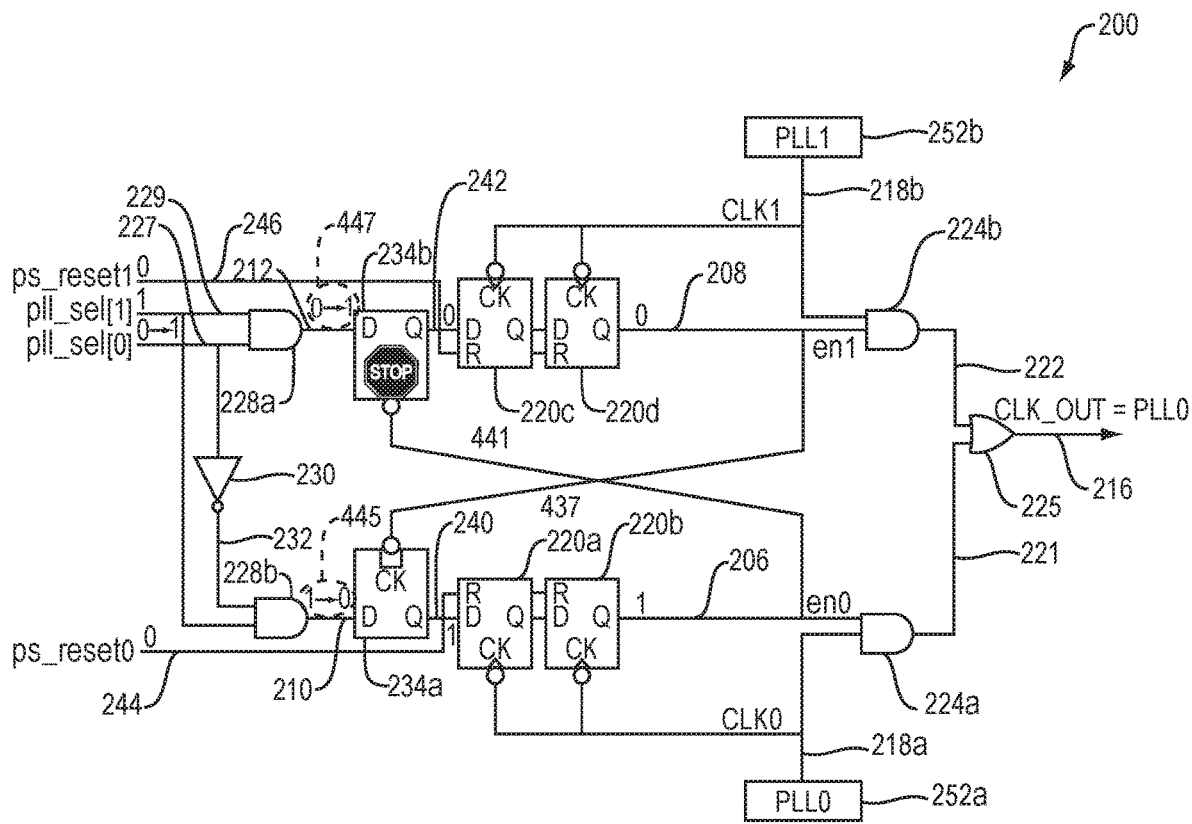

In the example embodiment of the sequence of operation, the sequence transitions from the F-stage of operation, disclosed in FIG. 4F, to a G-stage of operation, disclosed in FIG. 4G. In the G-stage of operation, the first selector 227 (i.e., pll_sel[0]) and the second selector 229 (i.e., pll_sel[1]) are configured as pll_sel[1:0]='11,' that is, PLL1 is now to be selected, and the selection decoder circuit 226, as disclosed above with regard to FIG. 2, decodes the first input enable 210 to be '0' and the second input enable 212 to be 1. As such, the first input enable 210 transitions 445 from '1' to '0' and the second input enable 212 transitions 447 from '0' to '1' in the G-stage.

In the G-stage, however, the new value of '0' for the first input enable 210 (i.e., pre_en0) has not yet propagated to the first propagated enable 206 (i.e., en0) and, thus, the second D-latch 234b remains closed and retains a value of '0' at its second Q-output 242 instead of passing through the new value of '1' for the second input enable 212. Thus, the output clock 216 (i.e., CLK_OUT) continues as the first phase-locked clock 218a in the G-stage.

Figure 4H:
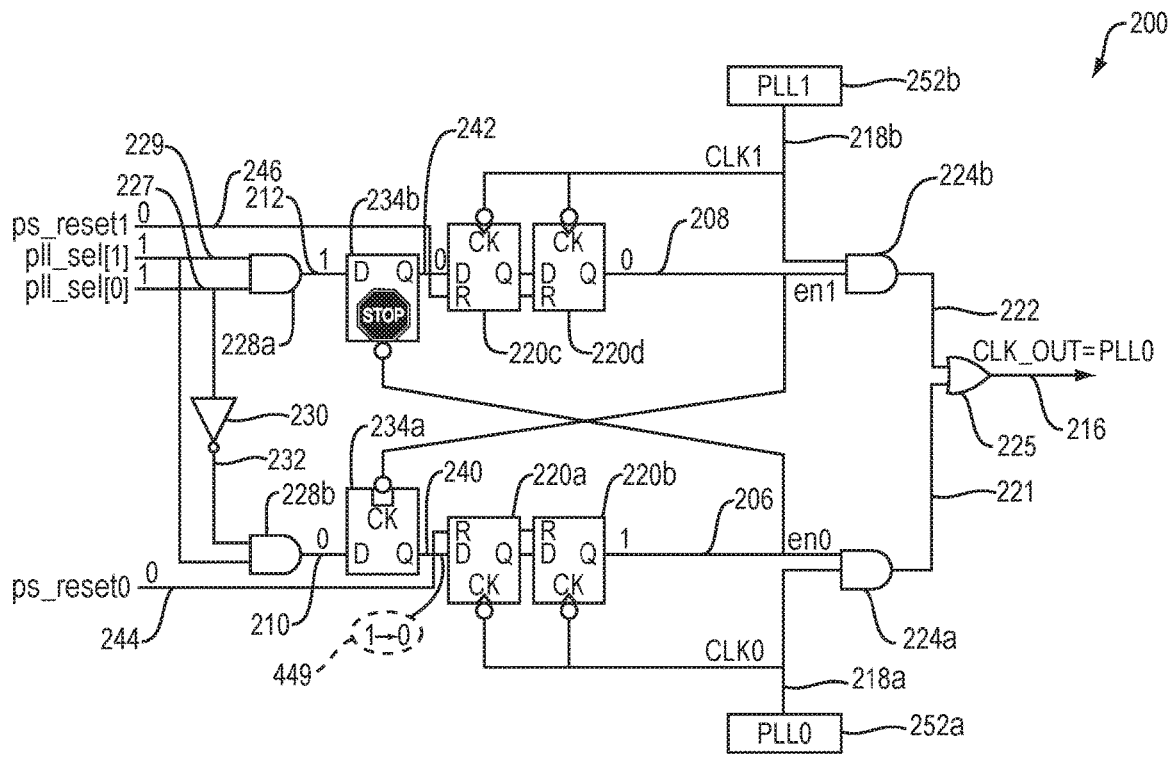

As disclosed in FIG. 4H, in a subsequent H-stage of operation, the new value of '0' for the first input enable 210 has passed through the first D-latch 234a causing its corresponding Q-output, that is, the first Q-output 240 to transition 449 from '1' to '0.' The new value of '0' for the first Q-output 240 has not yet been propagated to the first propagated input enable 206 by the first resettable FF 220a and the second resettable FF 220b of the first multi-flop synchronizer 236a. As such, the output clock 216 (i.e., CLK_OUT) continues as the first phase-locked clock 218a in the H-stage.

Figure 4I:
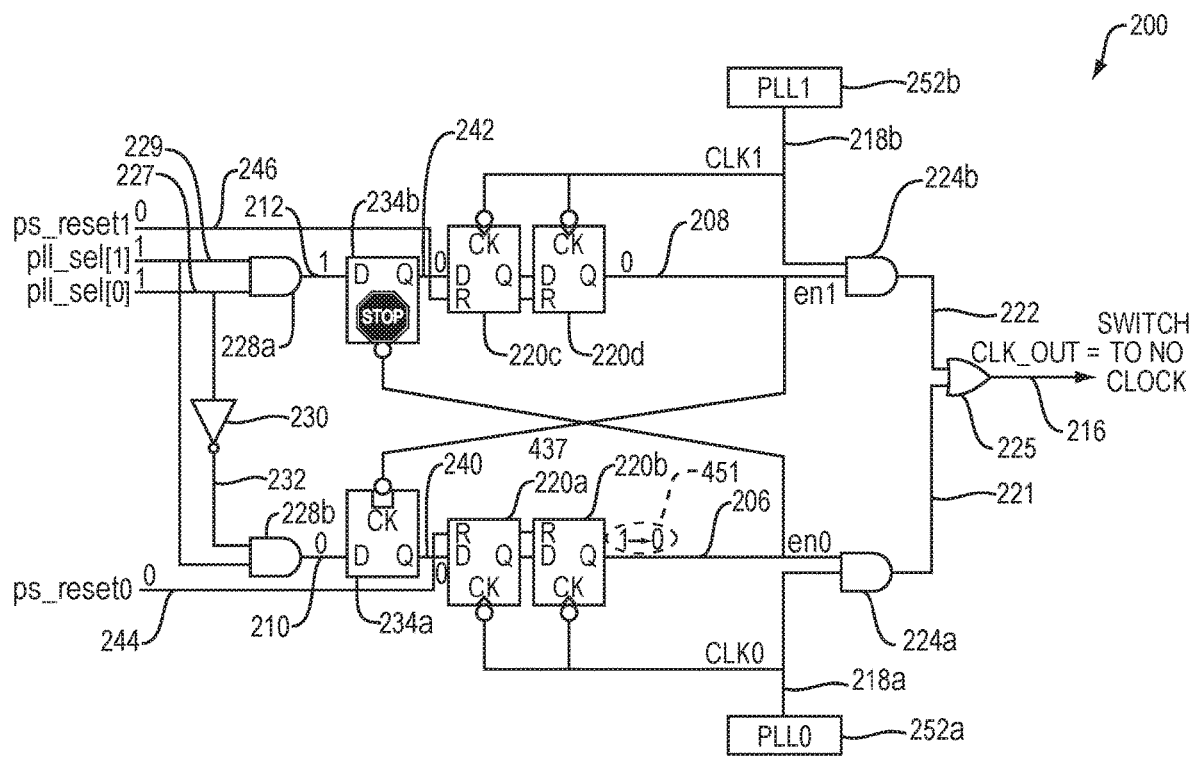

In the example embodiment of the sequence of operation, the sequence transitions from the H-stage of operation, disclosed in FIG. 4H, to an I-stage of operation disclosed in FIG. 4I. In the I-stage, the new value of '0' for the first input enable 210 has propagated to the first propagated enable 206, that is, the first multi-flop synchronizer 236a has transitioned 451, on a negative edge of the first phase-locked clock 218a, the first propagated enable 206 from a value of '1,' to the new value of '0,' decoded for the first input enable 210.

Figure 4J:
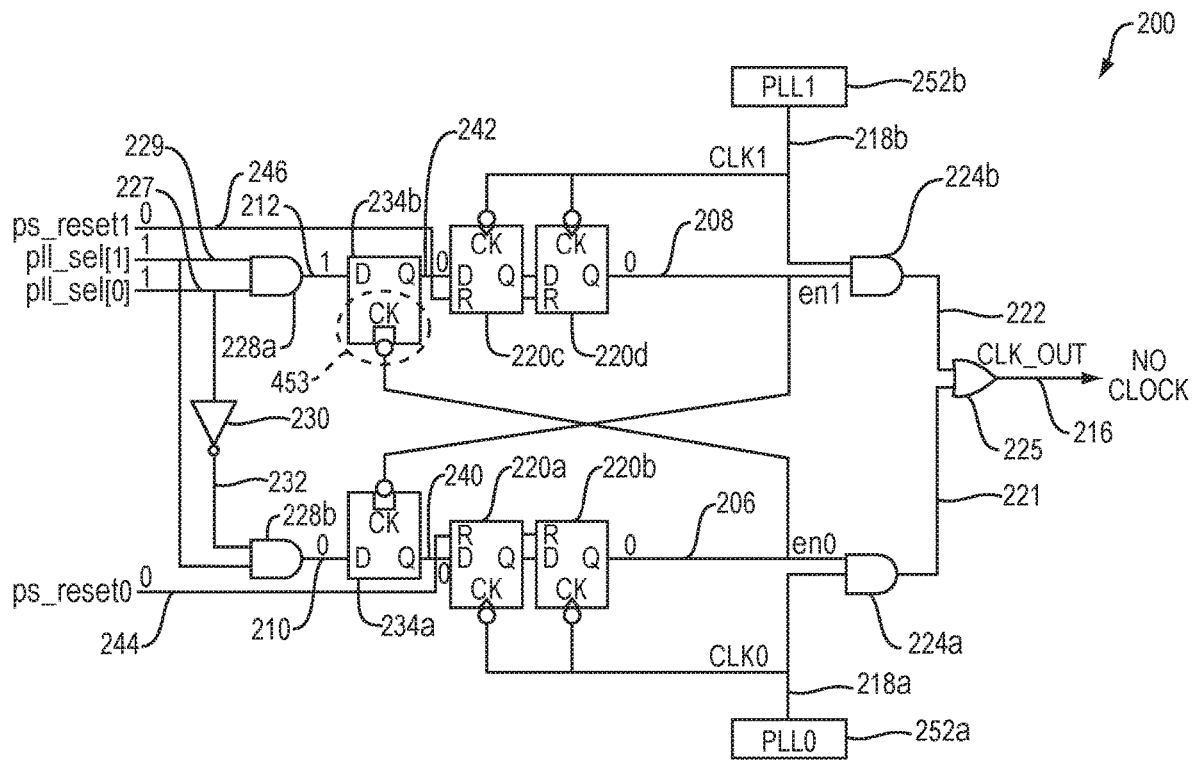

The new value of '0,' decoded for the first input enable 210 as disclosed with regard to the G-stage, above, has propagated to the first propagated enable 206 in the I-stage, causing the first gated clock 221 to change from the first-phased locked clock 218a to '1' and further causing the second D-latch 234b to open 453 in the J-stage, as disclosed in FIG. 4J. Since the second D-latch 234b has been opened, the new value of '1,' decoded for the second input enable 212 with regard to the stage-G, above, is passed through the second D-latch 234b causing its Q-output, that is, the second Q-output 242, to transition 455 in a K-stage as disclosed in FIG. 4K.

Figure 4K:
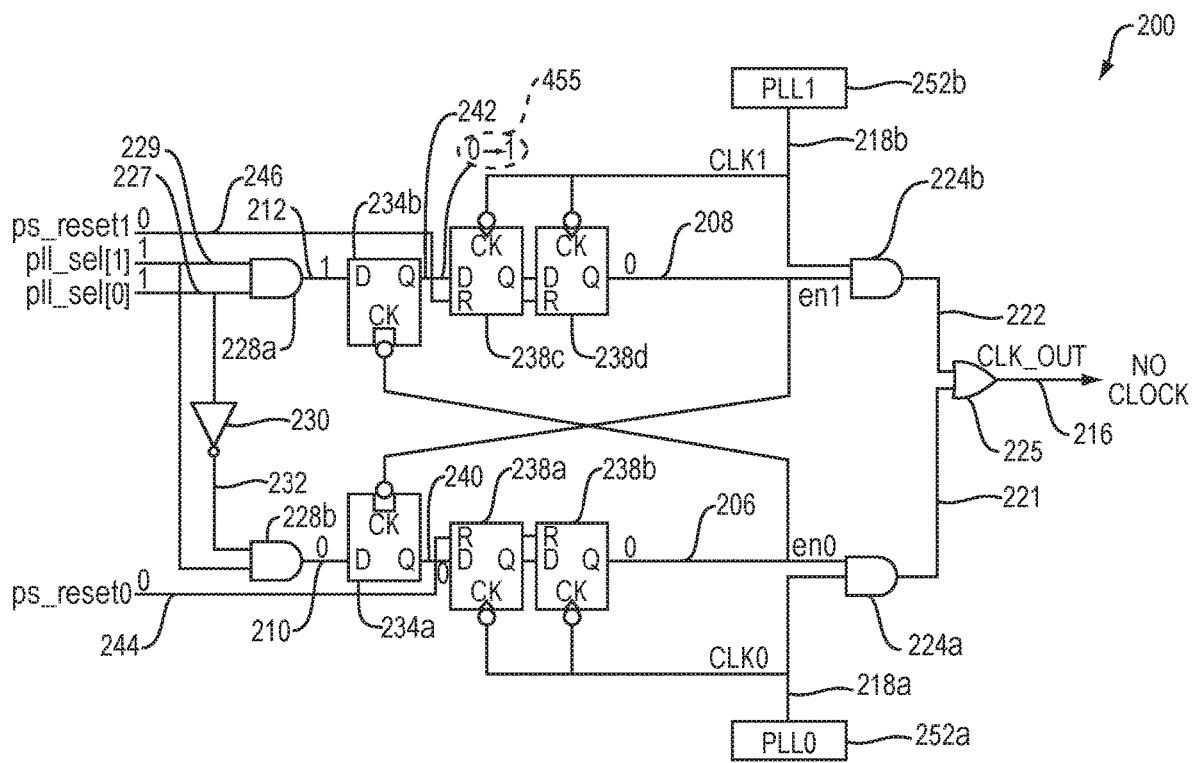

In the I-, J-, and K-stages of FIG. 4I, FIG. 4J, and FIG. 4K, respectively, the new value of '0,' decoded for the first input enable 210 (i.e., pre_en0) as disclosed above with regard to the G-stage, has propagated to the first propagated enable 206 (i.e., en0), causing the first gated clock 221 to be '1.' Further, the new value '1,' decoded for the second input enable 212 (i.e., pre_en1) as disclosed above with regard to the G-stage, has not yet propagated to the second propagated enable 208 (i.e., en1) and, thus, the second propagated enable 208 is '0' and the second gated clock 222 is '1' in the I-, J-, and K-stages.

Since both the first gated clock 221 and the second gated clock 222 are '1' in the I-, J-, and K-stages, the output clock 216 (i.e., CLK_OUT), that is output from the OR gate 225, switches from the first-phase locked clock to '0' in the I-, J-, and K-stages. Further, since the second gated clock 222 was held at '1' prior to and after the switch, no glitches have been introduced.

Figure 4L:
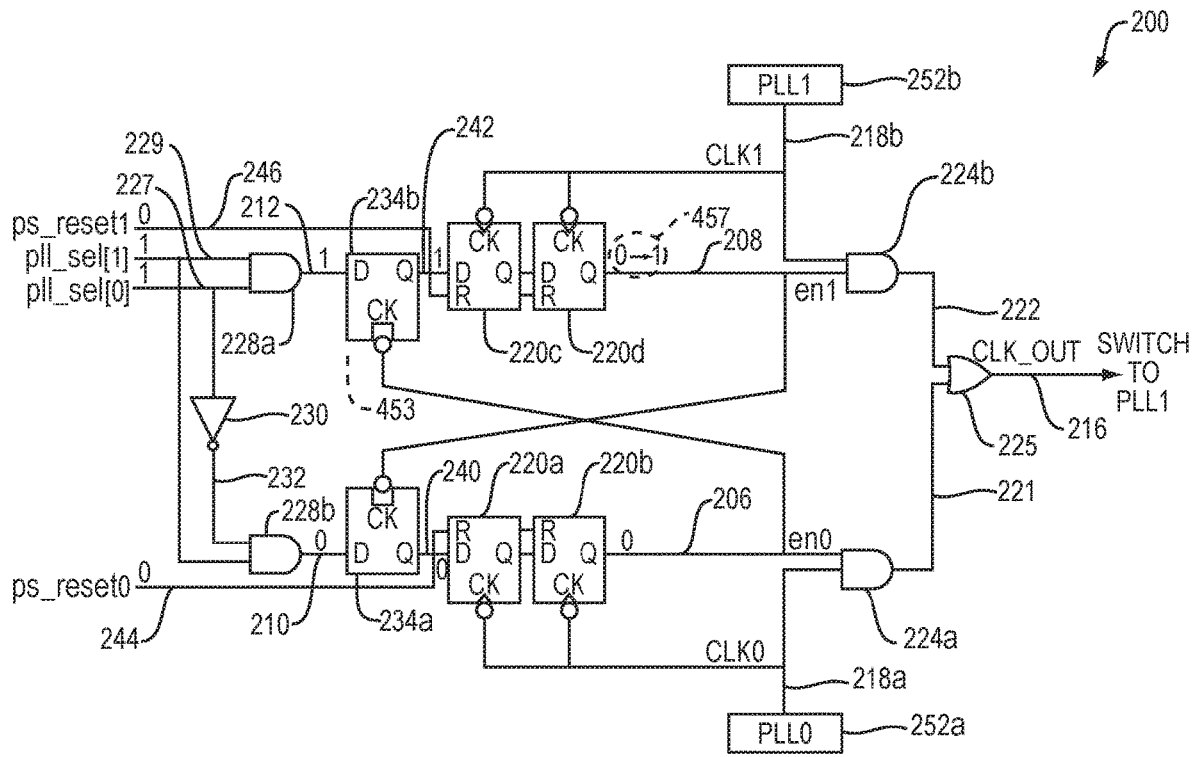

Since the second multi-flop synchronizer 236b is enabled, that is, released from reset, as disclosed above with regard to FIG. 4B and the B-stage, the third resettable FF 220c and the fourth resettable FF 220d both latch values from their respective D-inputs to their respective Q-outputs on negative (i.e., falling) edges of the second phase-locked clock 218b, causing the second multi-flop synchronizer 236b to transition 457 the second propagated enable 208 from '0' to '1' on a negative edge of the second phase-locked clock 218b in an L-stage, as disclosed in FIG. 4L.

In the L-stage, a value '1' of the second input enable 212 (i.e., pre_en1) has propagated to the second propagated enable 208 (i.e., pre_en0), enabling the second gated clock 222 to be the second phased-locked clock 218b output from the second PLL 252b. Since the first propagated enable 206 is '0,' the first gated clock 221 is at '1' and does not clock, and the output clock 216 (i.e., CLK_OUT), output from the OR gate 225, switches, glitch free, from being at '0' to the second phase-locked clock 218b, that is, PLL1.

Figure 4M:
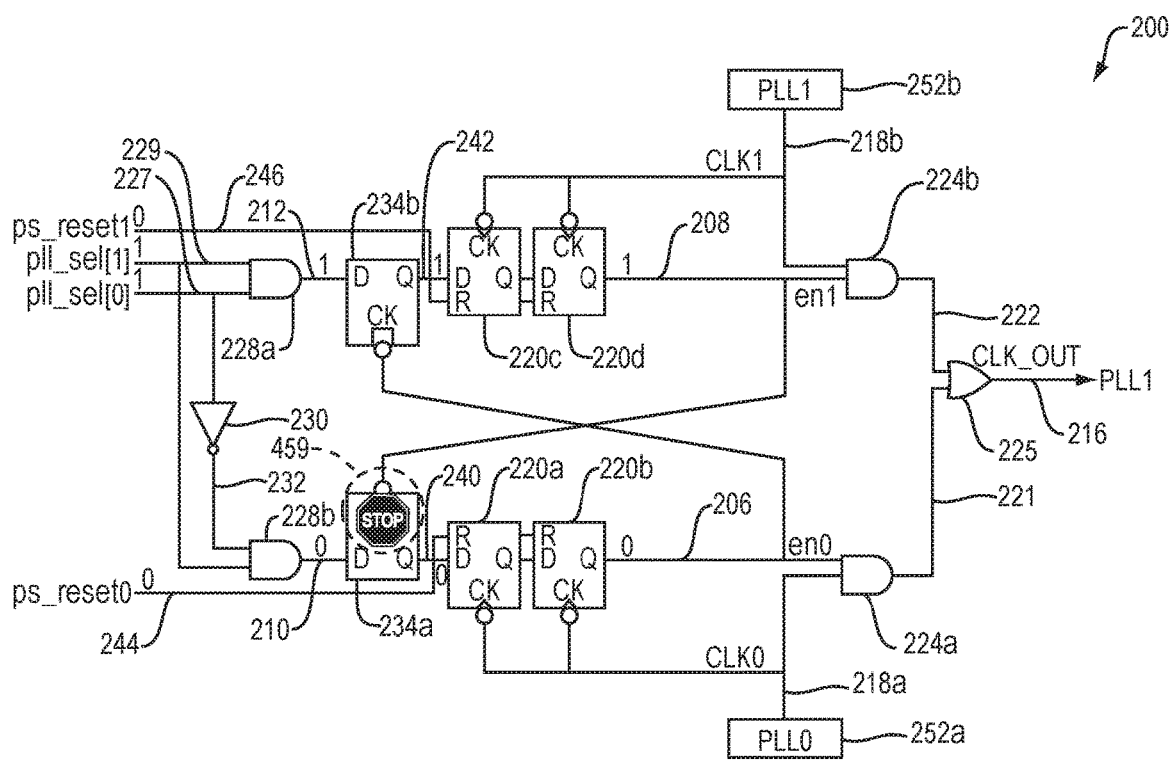

Further, in the L-stage, the value of '1' of the second input enable 212 (i.e., pre_en1) that has propagated to the second propagated enable 208 (i.e., en1) causes the first D-latch 234a to transition from being open to being closed, as disclosed with regard to an M-stage of FIG. 4M. In the M-stage, the first D-latch 234a has transitioned from being open to being closed 459, that is, from being enabled to being disabled. As such, the first D-latch 234a retains its '0' value on its Q-output, that is, the first Q-output 240, regardless of a value of the first input enable 210. Thus, the second propagated enable 208 gates (i.e., blocks) propagation of the first input enable 210, and the output clock 216 (i.e., CLK_OUT) is the second phase-locked clock 218b, that is, PLL1.

In the N stage, the sequence of operation thereafter ends, in the example embodiment. It should however, be understood that the sequence of operation of the glitch-free PLL multiplexer circuit 200 may continue, based on changes to any of the values of the first selector 227 (i.e., pll_sel[0]), second selector 229 (i.e., pll_sel[1]), first synchronizer reset 244 (i.e., ps_reset0), and second synchronizer reset 244 (i.e., ps_reset1). For example, the sequence of operation may keep toggling, such as by toggling the pll_sel[1:0] between '10,' to select PLL0, and '11,' to select PLL1. Further, it should be understood that the glitch-free PLL multiplexer circuit 200 is not limited to the sequence of operation disclosed above with regard to FIGS. 4A-N.

As should be appreciated from the foregoing, in an event the first propagated enable 206 (i.e., en0) is enabled, that is, '1,' then the output clock 216 is the first phase-locked clock 218a as the second propagated enable 208 (i.e., en1) is disabled, that is, '0.' An example embodiment prevents the second propagated enable 208 (i.e., en1) from changing from disabled to enabled while the output clock 216 is the first phase-locked clock 218a, that is, while the first phase-locked clock 218a is propagating to the output clock 216. Prior to enabling the second propagated enable 208 (i.e., en1), the first phase-locked clock 218a is stopped from propagating to the output clock 216 and then the second propagated enable 208 may be changed from disabled to enabled. As such, the output clock 216 may be switched, glitched-free, from the first phase-locked clock 218a to the second phase-locked clock 218b.

Likewise, the example embodiment prevents the first propagated enable 206 (i.e., en0) from changing from disabled to enabled while the output clock 216 is the second phase-locked clock 218b, that is, while the second phase-locked clock 218b is propagating to the output clock 216. Prior to enabling the first propagated enable 206 (i.e., en0), the second phase-locked clock 118b is stopped from propagating to the output clock 216 and then the first propagated enable 206 may be changed from disabled to enabled. As such, the output clock 216 may be switched, glitched-free, from the second phase-locked clock 218b to the first phase-locked clock 218a.

As disclosed above, the glitch-free PLL multiplexer circuit 200 enables the output clock 216 to switch, glitch-free, between the first phase-locked clock 218a, output from the first PLL 252a, and the second phase-locked clock 218b, output from the second PLL 252b. According to an example embodiment, such a switch may be performed within 1-2 cycles of a frequency of the second phase-locked clock 218b. Further, respective phases and frequencies of the first phase-locked clock 218a and the second phase-locked clock 218b require no relationship relative to one another for such glitch-free switching, and may have any relationship, as disclosed below, with regard to FIGS. 5A-D.

FIGS. 5A-D are waveform diagrams of example embodiments of four different phase-frequency scenarios between the two phase-locked clocks of FIG. 2 and the output clock 216 that switches frequency between same, as disclosed below.

Figure 5A:
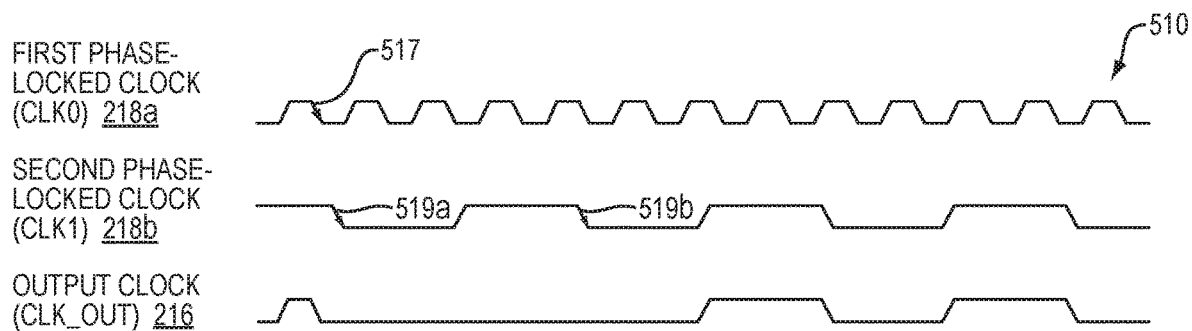
FIG. 5A is a waveform diagram of an example embodiment of switching an output clock from a first phase-locked clock to a second phase-locked clock, glitch-free, by the glitch-free PLL multiplexer circuit of FIG. 2, wherein the first phase-locked clock and the second phase-locked clock have a first phase-frequency relationship.

FIG. 5A is a waveform diagram 510 of an example embodiment of switching the output clock 216 from the first phase-locked clock 218a (i.e., CLK0) to the second phase-locked clock 218b (i.e., CLK1), glitch-free, by the glitch-free PLL multiplexer circuit 200 of FIG. 2, disclosed above, wherein the first phase-locked clock 218a and the second phase-locked clock 218b have a first phase-frequency relationship.

Figure 5B:
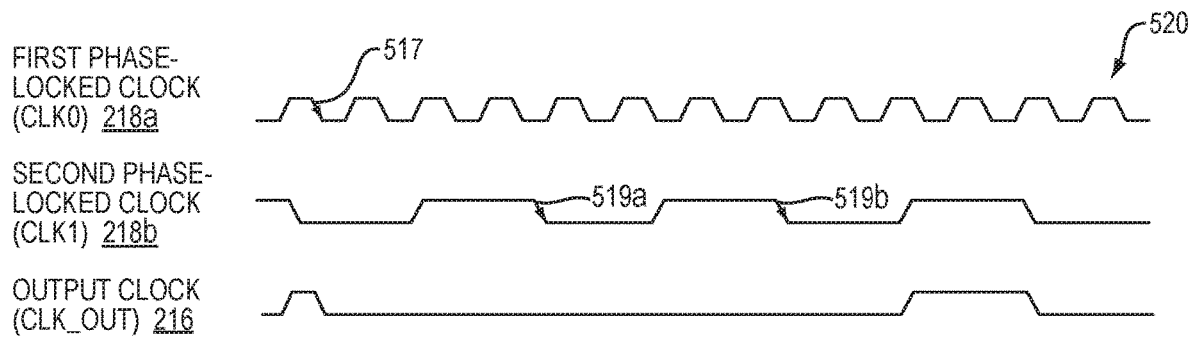
FIG. 5B is a waveform diagram of an example embodiment of switching the output clock from the first phase-locked clock to the second phase-locked clock, glitch-free, by the glitch-free PLL multiplexer circuit of FIG. 2, wherein the first phase-locked clock and the second phase-locked clock have a second phase-frequency relationship.

FIG. 5B is a waveform diagram 520 of an example embodiment of switching the output clock 216 from the first phase-locked clock 218a (i.e., CLK0) to the second phase-locked clock 218b (i.e., CLK1), glitch-free, by the glitch-free PLL multiplexer circuit 200 of FIG. 2, disclosed above, wherein the first phase-locked clock 218a and the second phase-locked clock 218b have a second phase-frequency relationship.

Figure 5C:
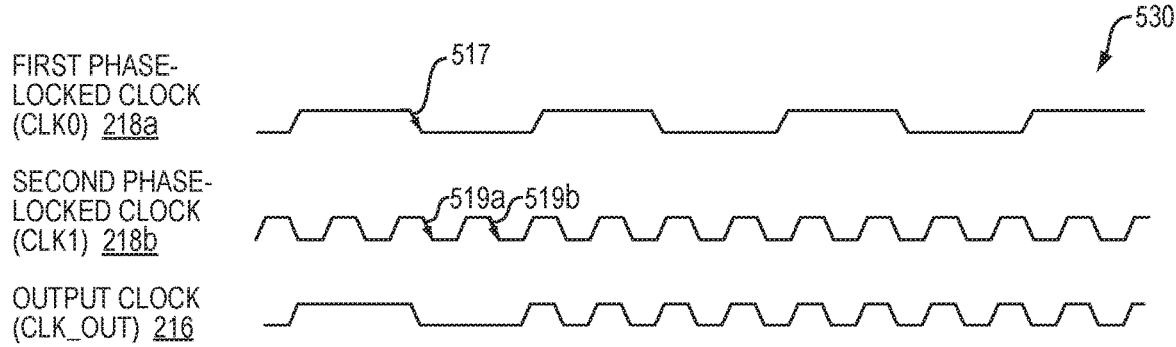
FIG. 5C is a waveform diagram of an example embodiment of switching the output clock from the first phase-locked clock to the second phase-locked clock, glitch-free, by the glitch-free PLL multiplexer circuit of FIG. 2, wherein the first phase-locked clock and the second phase-locked clock have a third phase-frequency relationship.

FIG. 5C is a waveform diagram 530 of an example embodiment of switching the output clock 216 from the first phase-locked clock 218a (i.e., CLK0) to the second phase-locked clock 218b (i.e., CLK1), glitch-free, by the glitch-free PLL multiplexer circuit 200 of FIG. 2, disclosed above, wherein the first phase-locked clock 218a and the second phase-locked clock 218b have a third phase-frequency relationship.

Figure 5D:
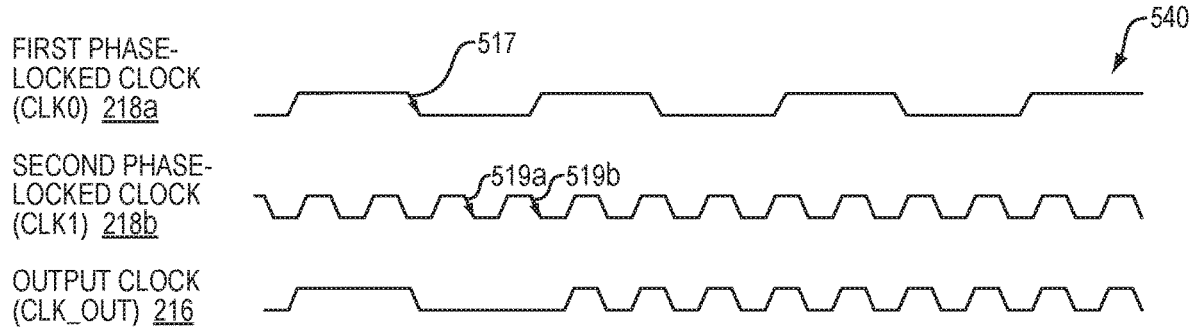
FIG. 5D is a waveform diagram of an example embodiment of switching the output clock from the first phase-locked clock to the second phase-locked clock, glitch-free, by the glitch-free PLL multiplexer circuit of FIG. 2, wherein the first phase-locked clock and the second phase-locked clock have a fourth phase-frequency relationship.

FIG. 5D is a waveform diagram 540 of an example embodiment of switching the output clock 216 from the first phase-locked clock 218a (i.e., CLK0) to the second phase-locked clock 218b (i.e., CLK1), glitch-free, by the glitch-free PLL multiplexer circuit 200 of FIG. 2, disclosed above, wherein the first phase-locked clock 218a and the second phase-locked clock 218b have a fourth phase-frequency relationship.

In the waveform diagrams 510, 520, 530, and 540, of FIG. 5A, FIG. 5B, FIG. 5C, and FIG. 5D, respectively, the negative edge (arrow) 517 on the first phase-locked clock 218a (i.e., CLK0) marks when the first propagated enable (i.e., en0) 206 makes a 1-to-0 transition causing the second D-latch 234b to open, that is, a path from the input D to the output Q of the second D-latch 234b is transparent. The two negative edges (arrows) 519a and 519b on the second phase-locked clock 218b (i.e., CLK1), mark when the second input enable 212 is sampled by the second multi-flop synchronizer 236b, i.e., a synchronizer flop that includes two back-to-back high-gain flops. As disclosed in each of the waveform diagrams 510, 520, 530, and 540, of FIG. 5A, FIG. 5B, FIG. 5C, and FIG. 5D, respectively, for a transition from the first phase-locked clock 218a (i.e., CLK0) to the second phase-locked clock 218b (i.e., CLK1), the output clock 216 (i.e., CLK_OUT) is expected to go low ('0') after a negative edge 517 of CLK0 and stays low ('0') for 1.5-2.5 cycles of CLK1, and subsequently switches, cleanly, to a positive edge of CLK1.

Figure 6:
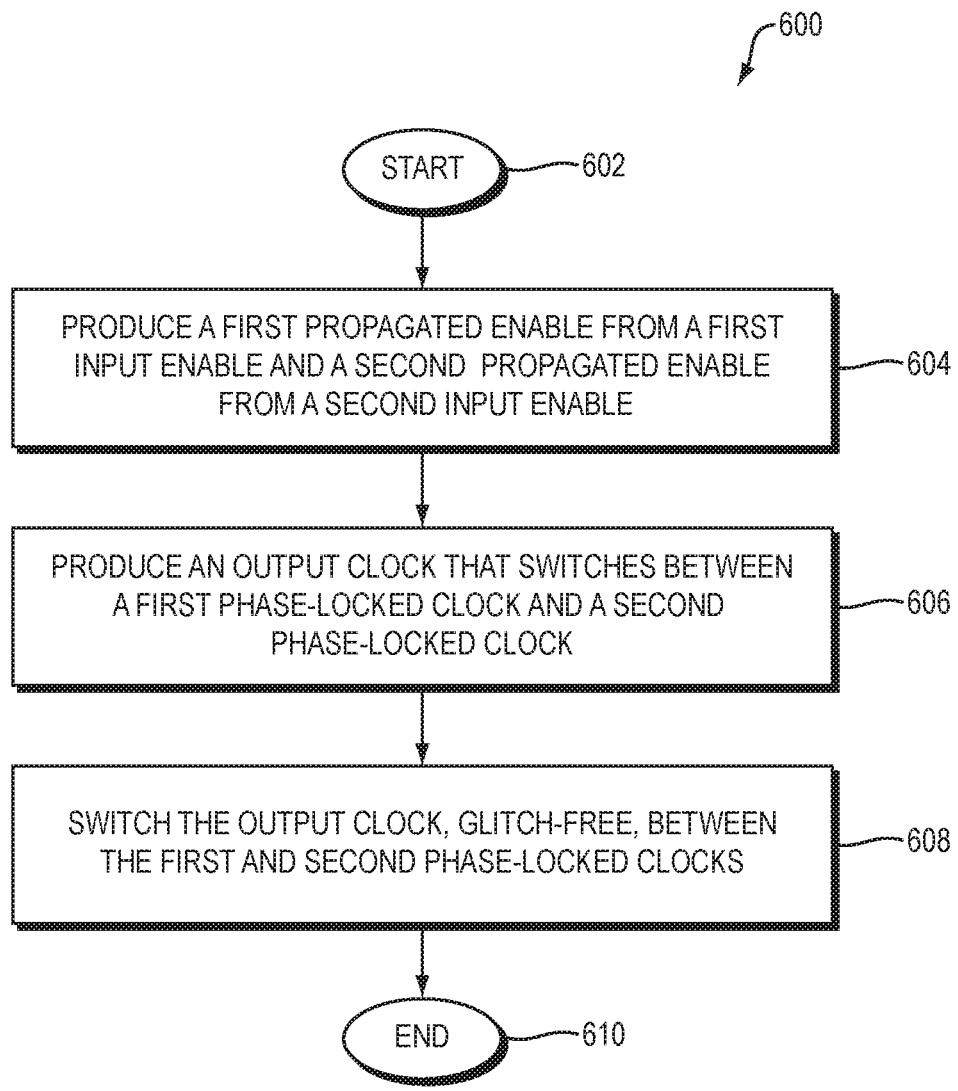
FIG. 6 is a flow diagram of a method for glitch-free frequency switching of a PLL multiplexer circuit.

FIG. 6 is a flow diagram 600 of a method for glitch-free frequency switching of a PLL multiplexer circuit, such as the glitch-free PLL multiplexer circuit 100 of FIG. 1, disclosed above. The method begins (602) and produces a first propagated enable from a first input enable and a second propagated enable from a second input enable (604). The method produces an output clock that switches between a first phase-locked clock and a second phase-locked clock (606). The method switches the output clock, glitch-free, between the first and second phase-locked clocks by employing the second propagated enable to gate propagation of the first input enable and by employing the first propagated enable to gate propagation of the second input enable, the switching including enabling the first and second input enables, alternately, causing the output clock to switch between the first and second phase-locked clocks (608) and the method thereafter ends (610), in the example embodiment.

The method may further comprise producing a first gated clock by combining the first propagated enable with the first phase-locked clock, producing a second gated clock by combining the second propagated enable with the second phase-locked clock, and producing the output clock as a function of the first and second gated clocks.

The method may further comprise producing the first gated clock by performing a logical AND of the first propagated enable with the first phase-locked clock, producing the second gated clock by performing a logical AND of the second propagated enable with the second phase-locked clock, and producing the output clock by performing a logical OR of the first and second gated clocks.

Producing the first and second input enables may include decoding a first selector and a second selector.

The decoding may include producing the second input enable by performing a logical AND of the first selector and the second selector, producing an inverted first selector by inverting the first selector, and producing the first input enable by performing a logical AND of the second selector and the inverted first selector.

The method may further comprise enabling a first D-latch with the second propagated enable, disabling the first D-latch with the second propagated enable, employing a first multi-flop synchronizer, the first multi-flop synchronizer configured to receive a first Q-output of the first D-latch and to output the first propagated enable, enabling a second D-latch with the first propagated enable, disabling the second D-latch with the first propagated enable, and employing a second multi-flop synchronizer, the second multi-flop synchronizer configured to receive a second Q-output of the second D-latch and to output the second propagated enable. The first D-latch may be configured to receive the first input enable at its D-input and enabling the first D-latch may include opening the first D-latch based on a low level of the second propagated enable. Disabling the first D-latch with the second propagated enable may include closing the first D-latch based on a high level of the second propagated enable. The second D-latch may be configured to receive the second input enable at its D-input and enabling the second-latch may include opening the second D-latch based on a low level of the first propagated enable. Disabling the second D-latch with the first propagated enable may include closing the second D-latch based on a high level of the first propagated enable.

The first multi-flop synchronizer may include a first resettable flip-flop (FF) cascaded with a second resettable FF, the second multi-flop synchronizer may include a third resettable FF cascaded with a fourth resettable FF. The method may further comprise clocking the first and second resettable FFs with the first phase-locked clock, resetting the first and second resettable FFs via a first synchronizer reset, clocking the third and fourth resettable FFs with the second phase-locked clock, and resetting the third and fourth resettable FFs via a second synchronizer reset.

The method may further comprise employing a first PLL to produce the first phase-locked clock and employing a second PLL to produce the second phase-locked clock. The respective phases and frequencies of the first and second phase-locked clocks may be independent of one another.

The switching may include switching, glitch-free, from the first phase-locked clock to the second phase-locked clock within 1-2 cycles of a frequency of the second phase-locked clock.

Further example embodiments disclosed herein may be configured using a computer program product; for example, controls such as the first selector 227 (i.e., pll_sel[0]), second selector 229 (i.e., pll_sel[1]), first synchronizer reset 244 (i.e., ps_reset0), and second synchronizer reset 246 (i.e., ps_reset1) may be programmed in software for implementing example embodiments.

Further example embodiments may include a non-transitory computer-readable medium containing instructions that may be executed by a processor, and, when loaded and executed, cause the processor to set controls as described herein. It should be understood that elements of the block and flow diagrams may be implemented in software or hardware, such as via one or more arrangements of circuitry, disclosed above, or equivalents thereof, firmware, a combination thereof, or other similar implementation determined in the future. In addition, the elements of the block and flow diagrams described herein may be combined or divided in any manner in software, hardware, or firmware. If implemented in software, the software may be written in any language that can support the example embodiments disclosed herein. The software may be stored in any form of computer readable medium, such as random access memory (RAM), read only memory (ROM), compact disk read-only memory (CD-ROM), and so forth. In operation, a general purpose or application-specific processor or processing core loads and executes software in a manner well understood in the art. It should be understood further that the block and flow diagrams may include more or fewer elements, be arranged or oriented differently, or be represented differently. It should be understood that implementation may dictate the block, flow, and/or network diagrams and the number of block and flow diagrams illustrating the execution of embodiments disclosed herein.

While example embodiments have been particularly shown and described, it will be understood by those skilled in the art that various changes in form and details may be made therein without departing from the scope of the embodiments encompassed by the appended claims.

What is claimed is:

1. A glitch-free phase-locked loop (PLL) multiplexer circuit, the circuit comprising:
    a first delay circuit and a second delay circuit, configured to produce first and second propagated enables, respectively, from first and second input enables, respectively; and
    an output clock circuit configured to produce an output clock that switches, glitch-free, between a first phase-locked clock and a second phase-locked clock, the first and second delay circuits further configured to enable the output clock to be switched, glitch-free, by employing the second propagated enable to gate propagation of the first input enable by causing a first input enable value of the first input enable to be retained by the first delay circuit and by employing the first propagated enable to gate propagation of the second input enable by causing a second input enable value of the second input enable to be retained by the second delay circuit, respectively, the first and second input enables configured to be enabled, alternately, causing the output clock to switch between the first and second phase-locked clocks.

2. The circuit of claim 1 wherein the output clock circuit is further configured to produce (i) a first gated clock by combining the first propagated enable with the first phase-locked clock, (ii) a second gated clock by combining the second propagated enable with the second phase-locked clock, and (iii) the output clock as a function of the first and second gated clocks.

3. The circuit of claim 2, wherein the output clock circuit includes:
    a first AND gate, configured to produce the first gated clock by performing a logical AND of the first propagated enable with the first phase-locked clock;
    a second AND gate, configured to produce the second gated clock by performing a logical AND of the second propagated enable with the second phase-locked clock; and
    an OR gate, configured to produce the output clock by performing a logical OR of the first and second gated clocks.

4. The circuit of claim 1 further comprising a selection decoder circuit configured to produce the first and second input enables by decoding a first selector and a second selector.

5. The circuit of claim 4, wherein the selection decoder circuit includes:
    an inverter configured to produce an inverted first selector by inverting the first selector;
    a first AND gate configured to produce the first input enable by performing a logical AND of the inverted first selector and the second selector; and
    a second AND gate configured to produce the second input enable by performing a logical AND of the first selector and the second selector.

6. The circuit of claim 1 wherein:
    the first delay circuit includes: a first D-latch, configured to receive the first input enable at its D-input and enabled by the second propagated enable; and a first multi-flop synchronizer, the first multi-flop synchronizer configured to receive a first Q-output of the first D-latch and configured to output the first propagated enable; and
    the second delay circuit includes: a second D-latch, configured to receive the second input enable at its D-input and enabled by the first propagated enable; and a second multi-flop synchronizer, the second multi-flop synchronizer configured to receive a second Q-output of the second D-latch and configured to output the second propagated enable, wherein the first D-latch is configured to be opened and closed by a low level and a high level of the second propagated enable, respectively, and the second D-latch is configured to be opened and closed by a low level and a high level of the first propagated enable, respectively, and wherein the first input enable value is retained at the first Q-output and wherein the second input enable value is retained at the second Q-output.

7. The circuit of claim 6, wherein:
    the first multi-flop synchronizer includes a first resettable flip-flop (FF) cascaded with a second resettable FF, the first and second resettable FFs clocked by the first phase-locked clock and configured to be reset via a first synchronizer reset; and
    the second multi-flop synchronizer includes a third resettable FF cascaded with a fourth resettable FF, the third and fourth resettable FFs clocked by the second phase-locked clock and configured to be reset via a second synchronizer reset, wherein the first and second resettable FFs are clocked on a negative edge of the first phase-locked clock and third and fourth resettable FFs are clocked on a negative edge of the second phase-locked clock.

8. The circuit of claim 1 wherein the circuit further comprises a first PLL configured to produce the first phase-locked clock and a second PLL configured to produce the second phase-locked clock.

9. The circuit of claim 1 wherein respective phases and frequencies of the first and second phase-locked clocks are independent of one another.

10. The circuit of claim 1 wherein the circuit enables the output clock to switch frequency, glitch-free, from the first phase-locked clock to the second phase-locked clock within 1-2 cycles of a frequency of the second phase-locked clock.

11. A method for glitch-free frequency switching of a phase-locked loop (PLL) multiplexer circuit, the method comprising:
    producing a first propagated enable from a first input enable and a second propagated enable from a second input enable;

producing an output clock that switches between a first phase-locked clock and a second phase-locked clock; and switching the output clock, glitch-free, between the first and second phase-locked clocks by employing the second propagated enable to gate propagation of the first input enable by causing a first input enable value of the first input enable to be retained and by employing the first propagated enable to gate propagation of the second input enable by causing a second input enable value of the second input enable to be retained, the switching including enabling the first and second input enables, alternately, causing the output clock to switch between the first and second phase-locked clocks.

12. The method of claim 11, further comprising:
producing a first gated clock by combining the first propagated enable with the first phase-locked clock;
producing a second gated clock by combining the second propagated enable with the second phase-locked clock; and
producing the output clock as a function of the first and second gated clocks.

13. The method of claim 12, further comprising:
producing the first gated clock by performing a logical AND of the first propagated enable with the first phase-locked clock;
producing the second gated clock by performing a logical AND of the second propagated enable with the second phase-locked clock; and
producing the output clock by performing a logical OR of the first and second gated clocks.

14. The method of claim 11 wherein producing the first and second input enables includes decoding a first selector and a second selector.

15. The method of claim 14, wherein the decoding includes:
producing an inverted first selector by inverting the first selector;
producing the first input enable by performing a logical AND of the inverted first selector and the second selector; and
producing the second input enable by performing a logical AND of the first selector and the second selector.

16. The method of claim 11, further comprising:
enabling a first D-latch with the second propagated enable, the first D-latch configured to receive the first input enable at its D-input, wherein the enabling includes opening the first D-latch based on a low level of the second propagated enable;
disabling the first D-latch with the second propagated enable, wherein the disabling includes closing the first D-latch based on a high level of the second propagated enable;
employing a first multi-flop synchronizer, the first multi-flop synchronizer configured to receive a first Q-output of the first D-latch and to output the first propagated enable;
enabling a second D-latch with the first propagated enable, the second D-latch configured to receive the second input enable at its D-input, wherein the enabling includes opening the second D-latch based on a low level of the first propagated enable;
disabling the second D-latch with the first propagated enable, wherein the disabling includes closing the second D-latch based on a high level of the first propagated enable; and employing a second multi-flop synchronizer, the second multi-flop synchronizer configured to receive a second Q-output of the second D-latch and to output the second propagated enable, wherein the first input enable value is retained at the first Q-output and wherein the second input enable value is retained at the second Q-output.

17. The method of claim 16, wherein the first multi-flop synchronizer includes a first resettable flip-flop (FF) cascaded with a second resettable FF, wherein the second multi-flop synchronizer includes a third resettable FF cascaded with a fourth resettable FF, and wherein the method further comprises:
clocking the first and second resettable FFs with the first phase-locked clock, wherein the first and second resettable FFs are clocked on a negative edge of the first phase-locked clock;
resetting the first and second resettable FFs via a first synchronizer reset;
clocking the third and fourth resettable FFs with the second phase-locked clock, wherein the third and fourth resettable FFs are clocked on a negative edge of the second phase-locked clock; and
resetting the third and fourth resettable FFs via a second synchronizer reset.

18. The method of claim 11, further comprising employing a first PLL to produce the first phase-locked clock and employing a second PLL to produce the second phase-locked clock.

19. The method of claim 11, wherein respective phases and frequencies of the first and second phase-locked clocks are independent of one another.

20. The method of claim 11, wherein the switching includes switching, glitch-free, from the first phase-locked clock to the second phase-locked clock within 1-2 cycles of a frequency of the second phase-locked clock.

21. A glitch-free phase-locked loop (PLL) multiplexer circuit, the circuit comprising:
a first delay circuit and a second delay circuit, configured to produce first and second propagated enables, respectively, from first and second input enables, respectively;
a selection decoder circuit configured to produce the first and second input enables by decoding a first selector and a second selector, the selection decoder circuit including an inverter configured to produce an inverted first selector by inverting the first selector, a first AND gate configured to produce the first input enable by performing a logical AND of the inverted first selector and the second selector, and a second AND gate configured to produce the second input enable by performing a logical AND of the first selector and the second selector; and
an output clock circuit configured to produce an output clock that switches, glitch-free, between a first phase-locked clock and a second phase-locked clock, the first and second delay circuits further configured to enable the output clock to be switched, glitch-free, by employing the second propagated enable to gate propagation of the first input enable and by employing the first propagated enable to gate propagation of the second input enable, respectively, the first and second input enables configured to be enabled, alternately, causing the output clock to switch between the first and second phase-locked clocks.

22. A method for glitch-free frequency switching of a phase-locked loop (PLL) multiplexer circuit, the method comprising:

producing a first propagated enable from a first input enable and a second propagated enable from a second input enable, the producing of the first and second input enables including decoding a first selector and a second selector, the decoding including producing an inverted first selector by inverting the first selector, producing the first input enable by performing a logical AND of the inverted first selector and the second selector, and producing the second input enable by performing a logical AND of the first selector and the second selector;

producing an output clock that switches between a first phase-locked clock and a second phase-locked clock; and switching the output clock, glitch-free, between the first and second phase-locked clocks by employing the second propagated enable to gate propagation of the first input enable and by employing the first propagated enable to gate propagation of the second input enable, the switching including enabling the first and second input enables, alternately, causing the output clock to switch between the first and second phase-locked clocks.

\* \* \* \* \*

UNITED STATES PATENT AND TRADEMARK OFFICE
CERTIFICATE OF CORRECTION

PATENT NO. : 10,530,370 B1
APPLICATION NO. : 16/209709
DATED : January 7, 2020
INVENTOR(S) : Nitin Mohan, Georgios Faldamis and Thucydides Xanthopoulos Page 1 of 1

It is certified that error appears in the above-identified patent and that said Letters Patent is hereby corrected as shown below:

In the Specification

In Column 1, Line 32, delete "dynamical" and insert --dynamically--

In Column 6, Line 31, delete "(i.e., 0')" and insert --(i.e., '0')--

In Column 8, Line 19, delete "interchangeable" and insert --interchangeably--

Signed and Sealed this
Twentieth Day of June, 2023

Katherine Kelly Vidal
*Director of the United States Patent and Trademark Office*